(12) United States Patent
Guimard et al.

(10) Patent No.: US 9,786,849 B2
(45) Date of Patent: Oct. 10, 2017

(54) ELECTRICALLY CONDUCTIVE OLED CARRIER, OLED INCORPORATING SAID CARRIER, AND ITS MANUFACTURE

(71) Applicant: SAINT-GOBAIN GLASS FRANCE, Courbevoie (FR)

(72) Inventors: Denis Guimard, Paris (FR); Julien Booz, Saint-denis (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/326,909

(22) PCT Filed: Jul. 9, 2015

(86) PCT No.: PCT/FR2015/051895
§ 371 (c)(1),
(2) Date: Jan. 17, 2017

(87) PCT Pub. No.: WO2016/009132
PCT Pub. Date: Jan. 21, 2016

(65) Prior Publication Data
US 2017/0207401 A1 Jul. 20, 2017

(30) Foreign Application Priority Data
Jul. 17, 2014 (FR) ...................... 14 56880

(51) Int. Cl.
*H01L 51/00* (2006.01)
*H01L 51/52* (2006.01)

(52) U.S. Cl.
CPC ...... *H01L 51/0096* (2013.01); *H01L 51/5203* (2013.01); *H01L 51/5262* (2013.01)

(58) Field of Classification Search
None
See application file for complete search history.

(56) References Cited

U.S. PATENT DOCUMENTS 6,645,645 B1 11/2003 Adachi et al.
2001/0033935 A1 10/2001 Laroche et al.
(Continued)

FOREIGN PATENT DOCUMENTS

EP 0 888 035 A1 12/1998
EP 1 406 474 A1 4/2004
(Continued)

OTHER PUBLICATIONS

International Search Report as issued in International Patent Application No. PCT/FR2015/051895, dated Oct. 27, 2015.
(Continued)

*Primary Examiner* — Khaja Ahmad
(74) *Attorney, Agent, or Firm* — Pillsbury Winthrop Shaw Pittman LLP

(57) ABSTRACT

An electrically conductive OLED carrier includes a glazing substrate; an electrode arranged in a metal grid made up of strands; an insulating light extraction layer under the metal grid; and a layer partially structured in its thickness, this layer being of given composition and of refractive index $n_3$ of 1.7 to 2.3, and being located on the light extraction layer, which partially structured layer is formed from a region structured with cavities containing the metal grid, and from another region, called the low region, located on the light extraction layer, the separation H between that surface of the structured region called the high surface, and that surface of the metal grid called the upper surface, and therefore that furthest from the substrate, is larger than 100 nm. The strands have along their length a central zone between lateral zones that are flush with the high surface.

28 Claims, 6 Drawing Sheets

(56) References Cited

U.S. PATENT DOCUMENTS

| | | | | |
|---|---|---|---|---|
| 2007/0013293 | A1* | 1/2007 | Cok | B82Y 20/00 313/504 |
| 2008/0315755 | A1* | 12/2008 | Han | H01L 51/5259 313/504 |
| 2009/0114928 | A1* | 5/2009 | Messere | B32B 17/10 257/88 |
| 2011/0156063 | A1* | 6/2011 | Lin | H01L 27/322 257/88 |

FOREIGN PATENT DOCUMENTS

| | | |
|---|---|---|
| EP | 2 178 343 A1 | 4/2010 |
| EP | 2 278 852 A1 | 1/2011 |
| GB | 2 289 289 A | 11/1995 |
| WO | WO 02/37568 A1 | 5/2002 |
| WO | WO 2004/025334 A2 | 3/2004 |
| WO | WO 2008/139934 A1 | 11/2008 |
| WO | WO 2009/071822 A2 | 6/2009 |
| WO | WO 2010/084922 A1 | 7/2010 |
| WO | WO 2010/084926 A1 | 7/2010 |
| WO | WO 2010/112786 A2 | 10/2010 |
| WO | WO 2011/089343 A1 | 7/2011 |
| WO | WO 2014/048927 A1 | 4/2014 |

OTHER PUBLICATIONS

Koura, N., "Chapter 17: Electroless Plating of Silver," *Electroless Plating—Fundamentals and Applications*, 1990, William Andrew Publishing/Noyes, pp. 441-462.

Greiner, H., "Light Extraction from Organic Light Emitting Diode Substrates: Simulation and Experiment," Japanese Journal of Applied Physics, vol. 46, No. 7A, 2007, pp. 4125-4137.

International Preliminary Report on Patentability and the Written Opinion of the International Searching Authority as issued in International Application No. PCT/FR2015/051895, dated Jan. 17, 2017.

\* cited by examiner

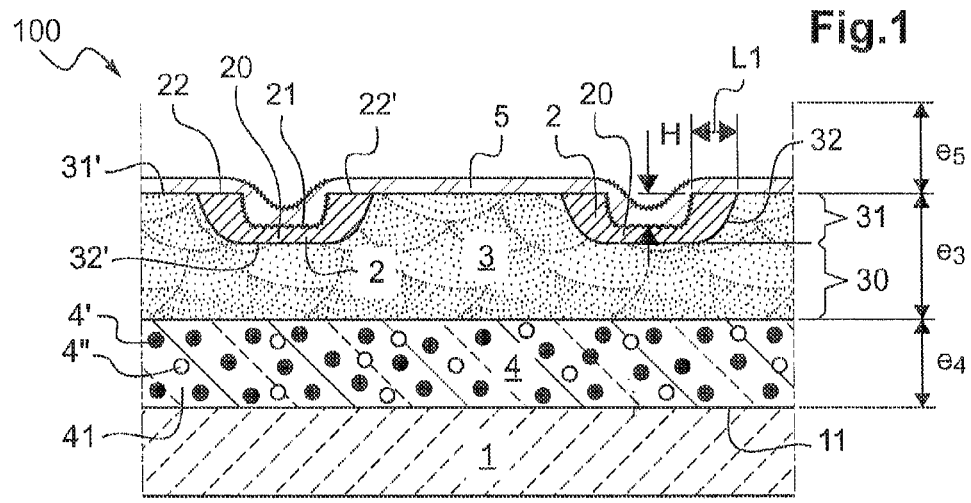
Fig.1
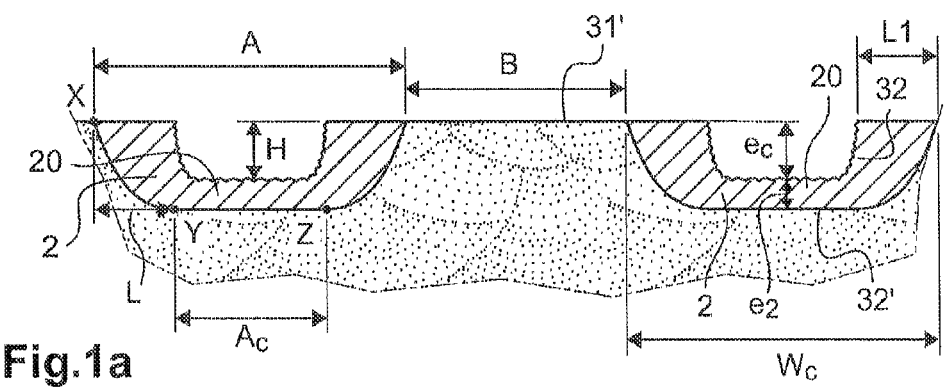
Fig.1a
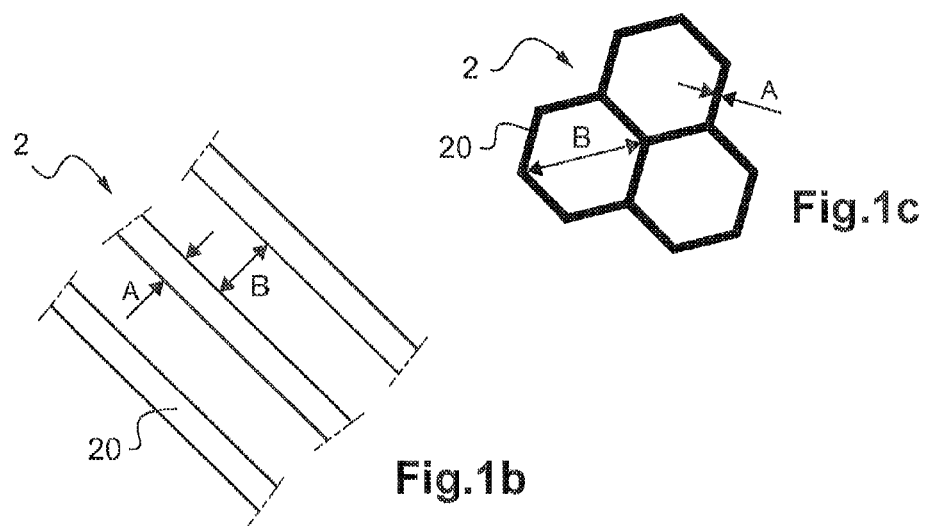
Fig.1b
Fig.1c

Fig.1f
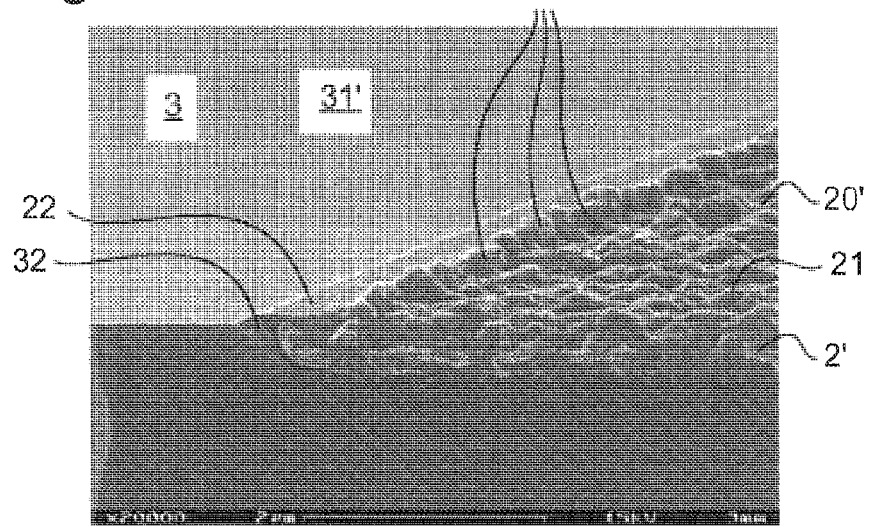
Fig.1g
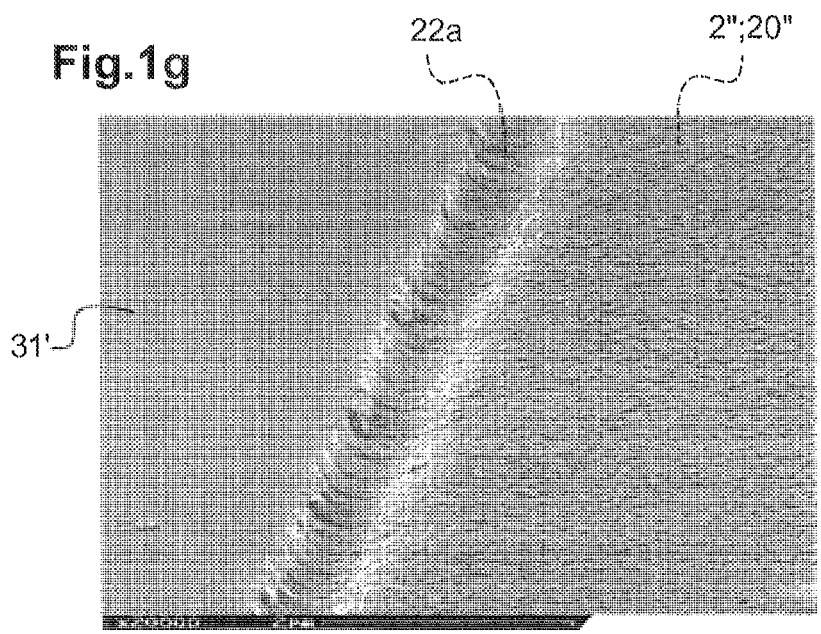
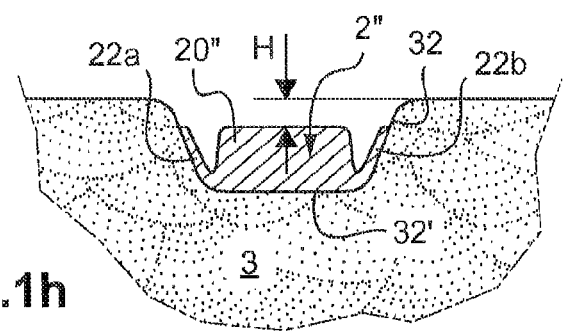
Fig.1h

ELECTRICALLY CONDUCTIVE OLED CARRIER, OLED INCORPORATING SAID CARRIER, AND ITS MANUFACTURE

CROSS-REFERENCE TO RELATED APPLICATIONS

This application is the U.S. National Stage of International Application Serial No. PCT/FR2015/051895, filed Jul. 9, 2015, which in turn claims priority to French Application No. 1456880, filed Jul. 17, 2014. The contents of all of these applications are incorporated herein by reference in their entirety.

The present invention relates to an electrically conductive carrier and to an organic light-emitting device incorporating said carrier and to its fabrication.

Organic light-emitting diodes (or OLEDs) conventionally comprise an organic light-emitting material or a stack of materials supplied with an electrical power via two flanking electrodes generally taking the form of electrically conductive layers.

Conventionally, the upper electrode is a reflective metal layer, for example made of aluminium, and the lower electrode is a transparent layer based on indium oxide, generally tin-doped indium oxide (better known as ITO), of about 100 to 150 nm in thickness. However, in order to uniformly illuminate large areas it is necessary to form a discontinuous lower electrode, which is typically done by forming electrode zones of a few $mm^2$ in size and by drastically decreasing the distance between each electrode zone, typically to about ten microns.

Patent application WO 2009/071822 describes an alternative lower electrode. More precisely, the lower electrode above all comprises a conductor made up of a 1 µm-thick aperiodic grid formed from irregular silver-based strands of an average width A of about 3 µm, spaced apart by an average distance B of about 30 µm, leading to a B/A ratio of 10.

This electrically conductive grid is manufactured by evaporating silver through a mask containing a self-organized network of apertures. The mask is then removed.

In this way, via a judicious choice of B/A and of the thickness, a sheet resistance of approximately 0.6 ohm/square is obtained for this grid, particularly low. The light transmission $T_L$ of this grid is about 70% and the strands are invisible to the naked eye.

In the embodiment described with reference to FIG. 3, a filling layer made of molten glass frit, which may have a high index, is added between the grid strands. The surface formed by the strands of the grid and the molten glass frit is smoothed by mechanical polishing, for example polishing employing alumina or cerium oxide. To manufacture the electrode, glass frit is deposited between and over the grid strands in order to form an overlayer on the strands. After baking, the surface is levelled down to the level of the strands.

An electrically conductive coating covering the grid and the filling layer preserves the smoothness and allows current to be distributed. The electrically conductive coating is ITO deposited by sputtering in order to obtain a resistivity ρ1 of about $10^{-4}$ ohm·cm, with a thickness from 40 nm, or is PEDOT/PSS deposited by wet processing.

Even though this electrode further contributes to increasing the overall performance of the OLED device (luminous efficiency, illumination uniformity, etc.) this performance could still be improved.

For this purpose, the present invention relates to a conductive OLED carrier comprising in this order:
  a (transparent, optionally translucent—especially if it has a textured surface) organic or mineral glass glazing substrate of refractive index $n_1$ lying in a range extending from 1.3 to 1.6, having a first main face called the first surface; and
  an electrode, which comprises a layer arranged in a grid called the metal grid, which grid is made of metal(s) (preferably a monolayer or even a multilayer of pure or alloyed metal(s)) having a sheet resistance smaller than 20Ω/□, better 10Ω/□, the metal grid having a thickness e2 of at least 100 nm and preferably of at most 1500 nm, the grid being formed from strands (what could also be called tracks) having a width A smaller than or equal to 50 µm, and being separated by an inter-strand distance B smaller than or equal to 5000 µm, these strands being separated by a plurality of electrically insulating non-electrically conductive fields of refractive index higher than 1.65,
the carrier comprising, on the same side as the first surface:
  an electrically insulating light extraction layer that typically extracts light via bulk and/or surface scattering of light, of given thickness $e_c$, preferably comprising (consisting of):
    the first surface of the substrate, which surface is a scattering surface (textured in order to scatter light); and/or
    an additional scattering layer (preferably directly) on the first surface of the (flat or textured) substrate, preferably (essentially) made of a mineral material containing scattering elements, for example of a material the refractive index $n_4$ of which is from 1.7 to 2.3, preferably from 1.80 to 2.10, and in particular from 1.85 to 2.00, containing scattering elements preferably having a refractive index $n_e$ different from $n_4$, preferably different by at least 0.1, preferably by at least 0.2 and in particular by at least 0.25; and
  an electrically insulating layer partially structured in its thickness, this layer being of given composition and of refractive index $n_3$ of 1.70 to 2.3, preferably of 1.80 to 2.10 and in particular of 1.85 to 2.00, which partially structured layer is located (preferably directly) on the light extraction layer and especially under and making contact with the grid—if appropriate the absolute value of the difference $n_3$-$n_4$ is preferably smaller than 0.1—which partially structured layer is formed:
    from a region (located furthest from the light extraction layer, otherwise called the high region) structured with cavities, this preferably electrically insulating region containing the non-electrically conductive fields, the cavities containing the metal grid; and
    from another (unstructured) region, located under the metal grid (and directly under the structured region), and (preferably directly) on the light extraction layer and preferably electrically insulating.

The grid is set back from the surface, called the high surface (furthest from the substrate), of the non-electrically conductive fields and the separation H between the high surface and the surface of the metal grid (called the upper surface, furthest from the substrate) is, in absolute value, larger than 100 nm, better still larger than 150 nm and preferably smaller than or equal to 500 nm. H is measured between the high surface and the middle of the surface of the strand. Furthermore, the strands have along their length a central zone between (flat) lateral zones that are flush with the high surface.

By inserting such a light extraction layer having a light scattering function between the grid and the glazing substrate, optical performance is considerably increased.

By placing the light extraction layer under the grid and not between the grid, it becomes possible to adjust the thickness of the grid (in particular influencing its sheet resistance) and the thickness of this light extraction layer (influencing its light extraction properties) independently. The total thickness E between the first surface of the substrate and the (lower face of the) metal grid is preferably at least 1 μm and better still between 5 and 30 μm.

Furthermore, the strands are elongate—separate or preferably interconnected (at least in the light-emitting region) and especially meshed.

During trials, the Applicant has observed the importance of a sufficient separation between the surface of the grid and the high surface. Specifically, in the case of protruding grids or grids set back with smaller values of H, the Applicant has observed the appearance of protuberances of height H1 of about 20 nm to 200 nm and of width W1 at half maximum of about 20 to 500 nm along the interior edges of the lateral zones (edges opposite the exterior edges making contact with the partially structured layer, flush with the high surface). These protuberances are continuous or discontinuous. These protuberances are disadvantageous because they are liable to increase leakage currents. The separation H according to the invention makes it possible to significantly limit these protuberances and their height or even to prevent their appearance.

The fact that each lateral zone is flush with the high surface is due to the manufacturing process: the metal is deposited using a wet deposition technique such as electroless deposition based on the reduction of a metal salt in solution, which deposition is carried out through apertures in a masking layer on the partially structured layer structured by wet etching. The flushness effect is independent of the metal thickness.

In particular, in the example of deposition by silvering, the silver is deposited in the cavities through apertures in a masking layer. The cavities are wider than the apertures in the masking layer because of the lateral etching that occurs during the formation of the partially structured layer by wet etching. The silver is deposited on the flanks and on the surface called the internal surface of the masking layer, which surface is located above each cavity, said internal surface being located in the plane of the high surface and therefore jutting out relative to the flanks of each cavity.

With a small separation H, protuberances are generated during removal of the masking layer in this zone of contact with the silver. It is presumed that when the separation H is small (almost flush strands) the rupture of the silver deposited in the cavity and that on the flanks of the masking layer is more difficult to achieve because the zone of masking layer/silver contact is larger.

Most of the strands and even each strand according to the invention may be devoid of these protuberances. According to the invention, the surface of the preferably silver strands is considered to be devoid of protuberances when these protuberances along the interior edges of the lateral zones have a height smaller than 10 nm.

Preferably, the metal grid is made of silver and obtained by silvering. It is even preferable, for the sake of simplicity, for the metal grid to make direct contact with the partially structured layer (no layers between the grid and the bottom of the cavities).

When deposited using a physical vapour deposition (PVD) technique such as magnetron cathode sputtering, shadowing effects, through apertures in a masking layer such as a layer made of (photo)resist, cause lateral zones of the strands to become cupped, forming a break in morphology of depth equivalent to the height $e_c$ of the cavities liable to generate short-circuits when the OLED is subsequently manufactured. In this type of deposition, for a set-back grid the strands have no lateral zones flush with the high surface.

Furthermore, silvering is simple, less complex than PVD (no vacuum tools etc.) and suitable for any size of grid. Moreover, the electrical conductivity of the silver deposited by silvering is satisfactory (typically 30% to 40% lower than that of a silver grid produced by PVD).

The lateral zones flush with the high surface are flat and smooth because of their contact with the (photoresist) masking layer, which itself has a smooth flat internal surface. The internal surface for its part reproduces the smooth and flat character of the high surface. The wet etching does not roughen the internal surface and the cavity flanks and bottom are also smooth. The discontinuity between lateral and central zones is less marked than for a PVD deposition, the discontinuity of amplitude H is largely smaller than $e_c$.

Preferably, the Rq roughness parameter (of the surface) of the (flat) lateral zones is at most 5 nm and even at most 3 nm and even at most 2 nm or even 1 nm. Furthermore, the Rmax (maximum height) in each (flat) lateral zone is preferably at most 20 nm and even of most 10 nm. These smooth lateral zones are a necessary condition for decreasing leakage currents.

These ranges of roughnesses are obtained for a grid deposited by silvering with the masking layer made of photoresist as described above.

Preferably, each lateral zone is of width L1 larger than the height $e_c$ of the cavity, with $L1 \leq 2e_c$ and even $L1 \leq 1.4e_c$. The surface roughness of the central zone, i.e. the zone set back from the high surface, may be higher than the surface roughness of the (smooth) lateral zones if a wet deposition technique such as electroless deposition (silvering, etc.) is used. The Rq (or rms) roughness parameter in the (roughest) central zone may be at least 10 nm and even at least 20 nm and preferably at most 60 nm. Furthermore, the Rmax (maximum height) roughness parameter in the (roughest) central zone may even be at least 100 nm and even at least 150 nm and preferably at most 500 nm.

The roughness of the central zone increases with the thickness of the metal grid.

The Rmax and Rq of the grid may be defined according to standard ISO4287 and measured by atomic force microscopy.

According to the invention a lateral zone flush with the high surface may be rigourously in the same plane as the high surface or be shifted therefrom by at most 10 nm and better still at most 5 nm.

Advantageously, the metal grid according to the invention may have a sheet resistance lower than or equal to 10 ohms/square, preferably lower than or equal to 5 ohms/square and even 1 ohm/square.

The one or more materials of the metal grid are chosen from the group formed by (especially pure) silver, copper, even nickel, or may be an alloy based on these metals. The grid is preferably based on silver.

The metal grid may preferably be a single (silver) layer or a multilayer (preferably containing at least 80% or even 90% silver).

The metal grid may be a multilayer, especially a silver multilayer, and comprise (even consist of) in this order:
- a first metal layer (located directly on the bottom of the cavities i.e. it is the metal layer closest to the bottom of the cavities) preferably made of a first metal, which is preferably based on silver or even consists of silver, forming less than 15% and even 10% of the total thickness $e_2$ of the grid and/or at least 3 nm, 5 nm or even at least 10 nm and preferably less than 100 nm or even less than 50 nm of the total thickness $e_2$; and
- a second metal layer (located on the first layer i.e. on the side opposite the substrate), especially having a discekble interface with the first layer, based on a second metal preferably chosen from silver, aluminium or copper, forming at least 70%, 80% and even 90% of the total thickness $e_2$ of the grid, which second layer is preferably based on silver or consists of silver, in particular as the first layer.

It is especially possible to form a silver-based first metal layer using a first deposition method, for example deposited by silvering, preferably with a thickness of at least 20 nm and even at least 30 nm, or by vacuum deposition (sputtering), and a silver-based second metal layer with a thickness of at least 3 nm or even 5 nm using a second deposition method, preferably electroplating. The advantage of electroplating is that it has a higher silver usage level than silvering and is a less expensive process than sputtering.

The metal grid may be a multilayer of layers of different materials, the last layer of this multilayer for example being a layer protecting against corrosion (water and/or air), which protective layer is made of a different material, for example a metal, especially not silver, to the underlying metal layer, and has a thickness smaller than 10 nm, better still than 5 nm or even 3 nm. This layer is particularly useful for a silver-based grid.

The metal grid may furthermore be a multilayer of two layers made of different materials, for example a bilayer composed of:
- a (single) metal layer made of the aforementioned materials and preferably based on or even made of silver, which layer is preferably at least 100 nm in thickness and for example deposited by silvering or vacuum deposition (sputtering); and
- an overlayer protecting against corrosion (water and/or air), which protective overlayer is made of a different material, for example a metal, especially not silver, to the metal layer, and has a thickness smaller than 10 nm, better still than 5 nm or even 3 nm.

The metal grid may be a metal layer, such as a silver layer, and be coated with an especially temporary, especially polymeric, protective overlayer.

The metal grid may be deposited preferably directly on the partially structured layer or even on a dielectric underlayer that especially forms a tie layer (having a tie function facilitating deposition of the grid material). The underlayer is located directly on the cavities (on the bottom and preferably all or some of the flanks of the cavities) of the partially structured layer and preferably is absent from the high surface, said tie layer preferably being a mineral layer, especially made of one or more oxides, and for example a transparent conductive oxide layer. The dielectric underlayer is of thickness $e_4$ smaller than 30 nm and even than 10 nm. This tie layer is easily deposited by magnetron cathode sputtering.

The thickness $e_2$ of the metal grid being smaller than the height $e_c$ of the cavities between the non-electrically conductive fields, preferably $e_c$ is larger than 200 nm, even larger than 250 nm or 500 nm.

A is chosen to be smaller than or equal to 50 μm in order to limit the visibility of the strands to the naked eye, and $e_2$ is chosen to be at least 100 nm in order to obtain the objective of a low Rsquare more easily.

The strands are interconnected in the active zone of the OLED or (only) connected via their ends to electrical contacts.

The presence alone of many scattering elements on the surface of the additional scattering layer, or of the texture of the scattering first surface, could, because of their excessive roughness, be a source of short-circuits if the grid were deposited directly thereon.

Therefore, it is preferable for the grid not to make contact with the surface of the light extraction layer but instead for it to be anchored in the partially structured layer, the high surface of which is preferably flat locally, at least on the scale relevant to short-circuits, i.e. over a length scale smaller than 50 μm and for example larger than 10 μm. The grid may take the form of linear strands running parallel to one another and connected to (together via) electrical contacts at their ends and/or even take the form of closed patterns or meshes (strands interconnected together defining closed patterns), for example geometric (rectangular, square, polygonal, honeycomb, etc.) patterns of nonuniform shape and/or nonuniform size. The grid may contain a linear zone (strips of strands or tracks) and a zone containing closed patterns (meshed strands or tracks). The structure of the partially structured layer will be adapted to this end.

The thickness e2 is not necessarily constant in a cavity. It is preferably defined at the centre of the surface of the strand. The width A is not necessarily constant in a given cavity. Preferably it is defined level with the upper surface of the grid. B may be defined, level with the upper surface of the grid, as the maximum distance between strands, this distance B especially corresponding to a maximum distance between two points of a mesh or the maximum distance between two separate neighbouring trench-type strands (whether straight or not).

A and B may vary from one strand to another. Since the grid is possibly nonuniform and/or the edges of the strands are possibly inclined, the dimensions A and B are therefore preferably average dimensions over the strands, just like $e_2$. The thickness $e_2$ (defined in the centre of the surface of the strands) may be smaller than 1500 nm, better still than 1000 nm, and especially from 100 nm to 1000 nm, or smaller than 800 nm, and in particular is from 200 nm to 800 nm.

The width A is preferably smaller than 30 μm. A is preferably in a range extending from 1 to 20 μm and even more preferably from 1.5 to 20 μm or even from 3 μm to 15 μm. B may be at least 50 μm and even at least 200 μm and B is smaller than 5000 μm, better still than 2000 μm and even than 1000 μm.

Another feature of the metal grid according to the invention is that it has a coverage T that is preferably smaller than 25% and better still than 10%, and even than 6% or than 2%.

In particular, it may be desirable for B to be between 2000 and 5000 μm when $e_2$ is between 800 and 1500 nm and A is comprised between 10 and 50 Ξm. This corresponds to a coverage comprised between 0.4 and 6.0%.

In particular, it may be desirable for B to be between 200 and 1000 μm when $e_2$ is smaller than 500 nm and A is comprised between 3 and 20 µm or even 3 to 10 µm. This corresponds to a coverage comprised between 0.5 and 22% or 0.5 to 11%.

The cavities (formed into a grid, defining the arrangement of the metal grid) are partially filled with the grid metal. The cavities are bounded by a bottom and flanks most often forming a cup.

The cavities separating the non-electrically conductive fields may be of height $e_c$ larger than 200 nm, and even of at least 250 nm or 500 nm and preferably smaller than 1500 nm or 1200 nm and of width $A_c$ smaller than or equal to 30 µm. $e_c$ is measured at the centre of the cavity. $A_c$ is preferably measured at the bottom of the cavity.

The cavities may form (one-dimensional) trenches, which are optionally regularly spaced and notably separate (at least in the light-emitting zone), of any shape, for example linear or serpentine trenches.

The cavities may form a periodic or aperiodic mesh, i.e. a (two-dimensional) network of interconnected apertures, of uniform or nonuniform mesh cell size and of any shape: especially of geometric shape (square, rectangle, honeycomb, etc.). The mesh cell size may be defined by a maximum width between two points of one mesh cell $B_c$.

A horizontal distance L is defined (between the high-surface end and the end closest to the cavity bottom) such that L is larger than $e_c$ and L≤$2e_c$ or even L≤$1.4e_c$. L is often larger than $e_c$ when wet etching is used to form the partially structured layer.

L1 is generally substantially equal to this horizontal distance L. More precisely, it is the width L0 of the jutting internal surface of the masking layer that is substantially equal to the horizontal distance L. L1 is about L0+$e_2$. Thus, the (lateral) extent of the cavities is preferably limited in order to decrease as best as possible the width of the strands. Furthermore, for a given Rsquare it is preferable for the strands to be large in thickness rather than large in size in order to increase transparency.

The partially textured layer is preferably located directly on the light extraction layer, and in particular is preferably able to cover or fill the roughness profile of the scattering first surface of the glass or of an additional scattering layer. Therefore, the high surface of the partially structured layer does not reproduce (or amplify) the roughness of the scattering first surface of the glass or of the additional scattering layer.

Therefore, it is preferable for the partially structured layer to contain few or no scattering particles, and even for it not to have a (significant) scattering function.

In order to preserve the high surface and make it as smooth as possible locally, (at least) the structured region, which is especially made of a vitreous material and preferably of an enamel, is preferably free from scattering particles throughout its thickness.

It may also be preferable for the structured region, which is preferably electrically insulating and preferentially made of a vitreous material and even better of an enamel, to contain no or few pores on its surface and even in its thickness.

Furthermore, in order to preserve the surface of the bottom of the cavities, the low region, which is especially made of a vitreous material and preferably of an enamel, is preferably free from scattering particles throughout its thickness. The low region possibly (only) contains pores (air or gas bubbles) whether they scatter light or not, especially in a concentration by volume smaller than 0.5%, preferably smaller than 0.2% and in particular smaller than 0.1%.

Regarding the scattering of the light, the low region, which is especially made of a vitreous material and preferably of an enamel, may contain pores but in amounts that are so small and/or that are so small (non-scattering) that they do not cause the partially structured layer to scatter light, especially not increasing the haze value of the substrate/light extraction layer/partially structured layer assembly relative to the haze of the substrate/light extraction layer alone.

The partially structured layer, which is especially made of a vitreous material and preferably of an enamel, may contain pores but in amounts that are so small and/or that are so small (non-scattering) that they do not cause this layer to scatter light (significantly) and preferably do not roughen the high surface.

The high surface of the partially structured layer, which is especially made of a vitreous material and preferably of an enamel, may preferably have an Ra roughness (the Ra parameter, which is the arithmetic mean divergence of the profile, is well known) lower than 5 nm, better still lower than 3 nm and even than 1 nm. The Ra roughness may be defined according to standard ISO4287 and measured by atomic force microscopy.

The surface of the layer intended to form the partially structured layer may exhibit large-scale undulations, for example having an amplitude of 1 µm over a lateral period W of 100 to 200 µm. These undulations do not adversely affect the structuring because the cavity width $A_c$ is much smaller than W.

The partially structured layer may have a thickness e3 larger than 3 µm and preferably smaller than 30 µm.

In order to obtain a high surface that is as flat as possible locally, in particular if the light extraction layer is an additional scattering layer made of a high-index matrix with scattering particles dispersed in the matrix, it is preferable for $e_3$ to be larger than 3 µm and even 5 µm or 8 µm and better still 9 µm, and preferably smaller than 30 µm and better still 25 µm. The preferred range is from 9 to 20 µm.

In order to obtain a high surface that is as flat as possible locally, in particular if the light extraction layer comprises a scattering surface, the first surface of the glass for example, it is preferable for $e_3$ to be larger than 5 µm and even 8 µm and even better still larger than 9 µm, and for $e_3$ preferably to be smaller than 30 µm and better still smaller than or equal to 25 µm. The preferred range is from 10 to 20 µm.

In one advantageous embodiment that is robust and simple to implement, the electrically insulating partially structured layer is a mineral layer preferably based on one or more oxides or essentially made of one or more oxides, and even more preferably is a vitreous material, in particular an enamel, based on a molten glass frit.

The partially structured layer may for example be made of the same vitreous material (enamel etc.) as the additional scattering layer, or of another vitreous material.

When these vitreous materials are identical, the interface between the additional scattering layer and the partially structured layer is not necessarily "marked"/visible even when they are deposited one after the other.

The enamel partially structured layer may contain pores but in amounts that are so small and/or that are so small that they do not cause the layer to scatter light (significantly) and/or preferably do not roughen the high surface.

The additional light extraction layer may comprise a scattering surface (having an index contrasting with the partially structured layer) and/or scattering elements (particles; pores, etc.) dispersed in a preferably high-index (mineral, and especially vitrous) medium (especially an enamel, etc.). The scattering surface may be formed by particles protruding from a (mineral, and especially vitrous) medium (especially an enamel, etc.) having an index contrasting with the partially structured layer.

The additional scattering layer may be a monolayer or a multilayer, and it may contain a gradient of scattering elements (the number of scattering elements, especially particles and/or bubbles, preferably decreasing in the direction of the grid) and may especially be a bilayer with a gradient of scattering elements and/or different scattering elements (different in nature and/or concentration).

The, enamel especially, additional scattering layer may have a thickness $e_4$ comprised between 1 μm and 80 μm, in particular of 2 to 30 μm and even of 3 to 20 μm.

The scattering elements, scattering particles in particular, may be distributed homogenously in the vitreous material. They may alternatively be distributed heterogeneously, in order to produce gradients for example. The additional scattering layer may also consist of a number of elementary layers that differ from one another in that the nature, size or proportion of scattering elements that they contain is different.

Preferably, the scattering elements are chosen from particles and pores. The additional scattering layer may contain both particles and pores.

The particles are preferably chosen from alumina particles, zirconia particles, silica particles, titanium dioxide particles, calcium carbonate particles and barium sulphate particles. The scattering layer may comprise a single type of particle, or a number of different types of particle.

The scattering elements preferably have a characteristic size allowing them to scatter visible light. The scattering elements (especially particles) preferably have an average diameter, determined by dynamic light scattering (DLS), comprised between 0.05 and 5 μm, and in particular between 0.1 and 3 μm.

The weight concentration of scattering particles in the additional scattering layer is preferably comprised in a range extending from 0.2 to 10%, especially from 0.5 to 8%, and even from 0.8 to 5%.

Although the chemical nature of the scattering particles is not particularly limited, they are preferably chosen from $TiO_2$ particles and $SiO_2$ particles.

A scattering layer taking the form of a polymer filled with scattering particles, for example as described in EP 1 406 474, may be used.

The optional additional scattering layer is preferably a mineral layer, preferably one based on one or more oxides, better still one essentially made of one or more oxides, and the partially structured layer is preferably a mineral layer, preferably a layer based on one or more oxides, and is especially identical to the additional scattering layer, and, preferably, the glass is mineral glass.

In a preferred embodiment, the additional scattering layer is a mineral layer located directly on the substrate, said layer being made of a high-index mineral material based on one or more oxides, which mineral material is preferably a vitreous material, in particular an enamel, and the scattering elements are preferably a porosity and/or mineral in nature (precipitated crystals, hollow or solid particles for example of oxides or non-oxide ceramics, etc.).

Advantageously, "all-mineral" solutions are preferred, in particular:
  the substrate is preferably made of mineral glass; the light extraction layer comprises (even consists of) an additional scattering layer containing scattering elements and a material that comprises (especially consists of) a vitreous material, preferably an enamel; and the composition of the partially structured layer comprises (especially consists of) a vitreous material, preferably an enamel, which composition is preferably identical to the material of the additional scattering layer;
  and/or the first (made) scattering surface of the substrate, which is preferably made of mineral glass, forms part of or even is the light extraction layer and the composition of the partially structured layer comprises (especially consists of) a vitreous material, preferably an enamel.

An enamel layer according to the invention (partially structured layer and/or additional scattering layer) is preferably obtained by a process in which a glass frit is mixed with a typically organic medium in order to form a paste (optionally containing scattering particles) that is preferably deposited by screen printing on the first mineral glass surface before being baked.

For an additional scattering layer made of enamel, the pores are preferably formed during the baking by elimination of organic compounds, for example from the medium. They are preferably closed and not connected.

Enamel high-index scattering layers and high-index enamel layers located on scattering layers are known in the prior art and are for example described in EP 2 178 343 and WO 2011/089343. High-index compositions are also described in patents WO 2010/084922 and WO 2010/084925.

The partially structured layer made of an enamel of index $n_3$, which layer preferably contains no scattering particles, may have a high bismuth oxide content, for example a bismuth oxide content of at least 40% by weight and better still at least 55% and preferably at most 85%. Preferably, an enamel having a glass transition temperature Tg lower than 520° C. and better still lower than or equal to 500° C. or even lower than or equal to 490° C., and especially of at least 450° C., will be chosen. The Tg is measured by differential scanning calorimetry (DLC). The baking temperature for forming the enamel is above the Tg but must not soften the glass substrate. Preferably, the baking temperature is below 600° C. and even below 570° C., especially when the Tg is 500° C. or less.

The additional scattering layer, which preferably contains scattering particles and optionally pores, may (also) be made of (scattering) enamel. Preferably, an enamel having a glass transition temperature Tg lower than 600° C. and better still lower than or equal to 550° C. or even lower than or equal to 500° C. will be chosen. The scattering enamel may have a high index, of at least 1.7, and have a high bismuth oxide content, for example a bismuth oxide content of at least 40% by weight and better still at least 55% by weight and preferably at most 85%. The Tg is measured by differential scanning calorimetry (DLC). The baking temperature for forming the enamel is above the Tg but must not soften the glass substrate. Preferably, the baking temperature is below 600° C. and even below 570° C., especially when the Tg is 500° C. or less.

The first surface may be rough enough to scatter light. Rough interfaces intended to extract light emitted by organic layers of OLEDs are known and for example described in patent applications WO 2010/112786, WO 02/37568 and WO 2011/089343. The roughness of the first surface of the substrate may be obtained by any appropriate known means, for example by acid etching (hydrofluoric acid), sandblasting or abrasion. The texture of the first surface of the (made) scattering substrate is preferably aperiodic and especially random, for application to white light.

The roughness of the substrate is characterized by the well-known roughness parameter Ra which is the arithmetic mean deviation of the profile, quantifying mean amplitude. Ra may be defined according to standard ISO4287 and measured by atomic force microscopy. Typically Ra is micron-sized and preferably lower than 5 μm and even than 3 μm.

When the adjective "scattering" is used to qualify the scattering first face and/or the additional scattering layer, it will preferably be understood that the haze (of the assembly made up of the glazing substrate and the light extraction layer and optionally the partially structured layer) is at least 60%, better still 70, and even 80% or 90%. The haze, sometimes called "veiling", is measured using a haze meter, such as that sold by BYK, and the protocol defined in standard ASTM D1003.

When the substrate does not have a scattering functionality (i.e. a rough scattering first surface) it is preferable for it to have a haze lower than 5%, better still than 2% and even lower than 1%.

Moreover, it is preferable for:
the assembly made up of the substrate and the light extraction layer to have a light transmission $T_L$ of at least 40%, even 50%, and preferably an absorption of at most 5%, even 3%; and
even for the substrate/light extraction layer (preferably made of a vitreous material/enamel)/partially structured layer (preferably made of a vitreous material, better still of an enamel and located directly on the light extraction layer) assembly to have a $T_L$ of at least 40%, even 50%, and preferably an absorption of at most 5%, even 3%.

The partially structured layer according to the invention may extend over a large area, for example an area larger than or equal to 0.005 m² or even larger than or equal to 0.5 m² or to 1 m². The grid according to the invention may extend over a large area, for example an area larger than or equal to 0.02 m² or even larger than or equal to 0.5 m² or to 1 m².

Typically a layer may be added, which layer acts as a barrier to alkali metals:
between the first surface of the mineral glass substrate (which surface is made scattering or is a flat, possibly polished surface) and the additional scattering layer; and/or
between the first surface of the mineral glass substrate (which surface is made scattering or is a conventional flat polished surface) and the preferably electrically insulating partially structured layer.

The surface of this layer, which is for example deposited by physical vapour deposition (PVD), is generally conformal with the surface of the substrate, the underlying surface, and therefore it does not play (or plays only a small) planarizing role.

The layer acting as a barrier to alkali metals or as a protective layer during etching may be based on silicon nitride, silicon oxycarbide, silicon oxynitride, silicon oxycarbonitride, silica, alumina, titanium oxide, tin oxide, aluminium nitride, titanium nitride or Ti(Zr)O and for example be of thickness smaller than or equal to 100 nm or even 30 nm and preferably larger than or equal to 3 nm or even 5 nm. It may be a question of a multilayer.

A moisture barrier layer may be added to the substrate if it is made of plastic (whether its surface is flat or made scattering). The barrier layer may be based on silicon nitride, silicon oxycarbide, silicon oxynitride, silicon oxycarbonitride, silica, alumina, titanium oxide, tin oxide, aluminium nitride, or titanium nitride and for example be of thickness smaller than or equal to 10 nm and preferably larger than or equal to 3 nm or even 5 nm. It may be a question of a multilayer.

In the present invention, all the refractive indexes are defined at 550 nm.

The electrically conductive carrier according to the invention may be used in a bottom-emitting organic light emitting device or in a top- and bottom-emitting organic light emitting device.

In the present invention, each and every dielectric layer may be doped. The term "doping" is conventionally understood to mean a presence of the element in an amount smaller than 10% by weight of metal element in the layer. A metal oxide or nitride may especially be doped to between 0.5 and 5%. Any metal oxide layer according to the invention may be a simple oxide or a mixed oxide, independently of whether this layer is doped or not.

In the present invention, when it is stated that a layer or coating (comprising one or more layers) is deposited directly under or directly on another deposit, what is meant is that no other layer can be interposed between these two deposits.

The electrically conductive carrier may comprise an electrically conductive coating that covers, preferably directly, the non-electrically conductive fields and the metal grid, which electrically conductive coating especially has a thickness $e_5$ smaller than or equal to 500 nm, a resistivity $\rho_5$ lower than 20 Ω·cm, even than 10 Ω·cm or than 1 Ω·cm and even than $10^{-1}$ Ω·cm and higher than the resistivity of the metal grid, and a given refractive index $n_5$ of at least 1.55, better still of at least 1.6 and even better still of at least 1.7.

The resistivity is preferably adjusted depending on the inter-strand distance. It is inversely proportional to B.

For example, for B=1000 μm and $e_5$=100 nm, a resistivity of less than 0.1 Ω·cm will preferably be used. For a B of 300 μm and $e_5$=100 nm, a resistivity of less than 1 Ω·cm is preferable.

The electrically conductive coating according to the invention contributes to a better distribution of the current.

The surface of the electrically conductive coating may preferably be intended to make contact with the organic layers of the OLED: especially the hole injection layer (HIL) and/or the hole transport layer (HTL) or to form part of the HIL or HTL, or play the role of HTL or HIL.

The (external) surface of the electrically conductive coating may furthermore exhibit very large-scale undulations, typically of larger than 0.1 mm. Moreover, the substrate may be curved.

The electrically conductive coating is preferably a monolayer rather than a multilayer.

The surface of the coating, especially obtained by a vapour deposition, may reproduce the surface roughness of the grid. The coating may be set back from the high surface above the central zone.

The coating may contain a work-function-matching layer that may, for example, have a work function Ws of 4.5 eV or more preferably 5 eV or more.

Thus, the electrically conductive coating may comprise (or preferably consist of) a mineral layer, preferably smaller than 150 nm in thickness, especially for matching work function, of refractive index $n_a$ comprised between 1.7 and 2.3, which layer, preferably the last layer of the coating (i.e. the layer furthest from the substrate) is based on a simple or mixed transparent electrically conductive oxide:
especially based on one or more of the following, optionally doped, metal oxides: tin oxide, indium oxide, zinc oxide, molybdenum oxide $MoO_3$, tungsten oxide $WO_3$, vanadium oxide $V_2O_5$;

(Preferably) of ITO, an (especially amorphous) layer for example based on tin zinc oxide SnZnO or based on indium zinc oxide (IZO) or based on indium tin zinc oxide (ITZO).

Preferably, a layer based on zinc oxide is doped with aluminium and/or gallium (AZO or GZO).

A layer made of a ZnO oxide is doped preferably with Al (AZO) and/or Ga (GZO) with the sum of the percentages by weight of Zn+Al or Zn+Ga or Zn+Ga+Al or of Zn+ other dopant preferably chosen from B, Sc or Sb or even from Y, F, V, Si, Ge, Ti, Zr, Hf and even by In that is at least 90% of the total weight of metal and better still at least 95% and even at least 97.

It may be preferable for an AZO layer according to the invention for the percentage by weight of aluminium in the sum of the percentages by weight of aluminium and zinc, in other words Al/(Al+Zn), to be lower than 10% and preferably lower than or equal to 5%.

To do this, it is possible and preferable to use a ceramic target of aluminium oxide and zinc oxide such that the percentage by weight of aluminium oxide in the sum of the percentages by weight of zinc oxide an aluminium oxide, typically $Al_2O_3/(Al_2O_3+ZnO)$, is lower than 14% and preferably lower than or equal to 7%.

It may be preferable for a layer of GZO according to the invention for the percentage by weight of gallium in the sum of the percentages by weight of zinc and gallium, in other words Ga/(Ga+Zn), to be lower than 10% and preferably lower than or equal to 5%.

To achieve this it is possible and preferable to use a ceramic target of zinc and gallium oxide such that the percentage by weight of gallium oxide in the sum of the percentages by weight of zinc oxide and gallium oxide, typically $Ga_2O_3/(Ga_2O_3+ZnO)$, is lower than 11% and preferably lower than or equal to 5%.

In a layer chosen to be based on tin zinc oxide (SnZnO), the percentage of Sn in the total weight of metal will preferably be from 20 to 90% (and preferably from 80 to 10% for the Zn) and in particular from 30 to 80% (and preferably from 70 to 20 for the Zn), the Sn/(Sn+Zn) weight ratio preferably ranging from 20 to 90% and in particular from 30 to 80%.

The mineral layer, which is preferably made of ITO or based on zinc oxide, preferably has a thickness smaller than or equal to 60 nm, 50 nm or 40 nm or even 30 nm and even 10 nm and is of resistivity lower than $10^{-1}$ Ω·cm. Preferably, a layer is chosen deposited by physical vapour deposition and in particular by magnetron sputtering, chosen from ITO and ZnO (AZO, GZO, AGZO) or even $MoO_3$, $WO_3$ or $V_2O_5$.

The expression "indium tin oxide" (or even "tin-doped indium oxide" or the term "ITO") will preferably be understood to mean a mixed oxide or a mixture obtained from oxides of indium (III) ($In_2O_3$) and tin (IV) ($SnO_2$), preferably in weight proportions comprised between 70 and 95% for the first oxide and 5 to 20% for the second oxide. A typical weight proportion is about 90% by weight of $In_2O_3$ for about 10% by weight of $SnO_2$.

The electrically conductive coating may consist of the mineral layer of refractive index $n_a$ comprised between 1.7 and 2.3, which is then equal to $n_5$.

The electrically conductive coating may comprise or consist of, or at least the last layer (of the coating) i.e. the layer furthest from the substrate, may comprise or consist of, an organic layer, made of one or more (electrically) conductive polymers, of submicron-sized thickness e'5 and of refractive index $n_b$ of at least 1.55 and better still 1.6, this polymer layer possibly playing the role of a hole transport layer (HTL) or hole injection layer (HIL) in an organic light-emitting system.

The electrically conductive coating may consist of the organic layer of refractive index $n_b$ comprised between 1.7 and 2.3, which is then equal to $n_5$.

For example, it may be a question of a layer of one or more (electrically) conductive polymers from the polythiophene family, such as PEDOT, i.e. poly(3,4-ethylene dioxythiophene) or PEDOT/PSS, i.e. poly(3,4-ethylene dioxythiophene) mixed with poly(styrenesulfonate).

By way of commercial PEDOT or PEDOT:PSS, mention may be made of the following products sold by Heraeus:
Clevios™ FET of ρ of less than $10^{-2}$ ohm·cm; or
Clevios™ HIL 1.1. of ρ of about 10 ohm·cm.

The (electrically) conductive polymer forms part of the electrode and also optionally serves as a hole injection layer (HIL).

The electrically conductive coating may be a multilayer and comprises (preferably directly) under the aforementioned mineral layer (which is especially the last layer) or the aforementioned organic layer (which is especially the last layer), a first layer directly on the metal grid (monolayer or multilayer grid), which first layer is made of a transparent electrically conductive oxide of thickness e'5 smaller than 200 nm and of index n'5 comprised between 1.7 and 2.3, the difference in absolute value of n'5-$n_3$ preferably being less than 0.1, this layer especially being chosen from:
preferably a layer based on zinc oxide especially doped with aluminium and/or gallium (AZO or GZO), or optionally ITZO; and/or
an (especially amorphous) layer for example based on tin zinc oxide SnZnO preferably of thickness smaller than 100 nm, or based on indium zinc oxide (denoted IZO), or based on indium tin zinc oxide (denoted ITZO).

The AZO or GZO layer may for example allow the thickness of the mineral layer, especially the ITO layer, to be decreased to less than 50 nm.

The electrically conductive carrier may also comprise a temporary (removable) protective layer, for example a mineral layer, for example made of an oxide or nitride, or a polymeric layer, in order to allow the carrier to be transported to the point of deposition of the electrically conductive coating, which point is separate from the point of deposition of the grid.

The substrate may be flat or curved, and furthermore may be stiff, flexible or semiflexible.

Its main faces may be rectangular, square or even any other shape (round, oval, polygonal, etc.). This substrate may be large in size, for example having an area larger than 0.02 $m^2$ or even 0.5 $m^2$ or 1 $m^2$ and the lower electrode may occupy substantially all this area (excluding structuring zones).

The substrate may be a substantially transparent substrate made of a mineral material or a plastic material such as polycarbonate PC, polymethyl methacrylate PMMA or even PET, polyvinyl butyral PVB, polyurethane PU, polytetrafluoroethylene PTFE, etc.

The substrate is preferably made of mineral glass, especially soda-lime-silica glass obtained by the float process, the float process consisting in pouring molten glass onto a molten tin bath. The substrate is preferably colourless and (alone) has a light transmission factor of at least 80%, even 90%, as defined in standard EN 410:1998.

The substrate may advantageously be made of glass having an absorption coefficient lower than 2.5 $m^{-1}$, preferably lower than 0.7 $m^{-1}$ at the wavelength(s) emitted by the OLEDs. Soda-lime-silica glasses containing less than 0.05% Fe III or $Fe_2O_3$, especially Diamant glass from Saint-Gobain Glass, Optiwhite glass from Pilkington, and B270 glass from Schott, will for example be chosen. Any of the extra-clear glass compositions described in document WO 04/025334 may be chosen.

The thickness of the glazing substrate may be at least 0.1 mm, and preferably lies in a range extending from 0.1 to 6 mm, especially from 0.3 to 3 mm.

The carrier such as defined above may furthermore comprise an organic light-emitting system deposited (preferably directly) on the electrically conductive coating, optionally including a hole transport layer HTL or a hole injection layer HIL.

The invention also relates to an organic light-emitting device incorporating the carrier such as defined above, the electrode with the metal grid forming what is called the lower electrode, i.e. the electrode closest to the substrate, generally the anode, especially covered with a light-emitting layer made of organic light-emitting material(s), said light-emitting layer being covered by the upper electrode, generally the cathode For the upper electrode a (reflective, semi-reflective, etc.) metal layer may be used, for example made of Ag, Al, Pd, Cu, Pd, Pt, In, Mo, Au.

The OLED device may produce monochromatic light, especially blue and/or green and/or red light, or be suitable for producing white light.

There are a number of possible methods for producing white light: compounds (red, green, blue emission) may be blended in a single layer; three organic structures (red, green, blue emission) or two organic structures (yellow and blue) may be stacked on the face of the electrodes; a series of three adjacent organic structures (red, green, blue emission) may be used; and/or an organic structure emitting a single colour may be placed on the face of the electrodes, while layers of suitable phosphors are placed on the other face.

The OLED device may comprise a plurality of adjacent organic light-emitting systems, each emitting white light or, in series of three, red, green and blue light, the systems for example being connected in series.

Each row may for example emit a given colour.

OLEDs are generally divided into two large families depending on the organic material used.

If the light-emitting layers are formed from small molecules, the devices are referred to as small-molecule organic light-emitting diodes (SM-OLEDs). The organic light-emitting material of the thin layer consists of evaporated molecules, such as for example the complex $AlQ_3$ (tris(8-hydroxyquinoline)aluminium), DPVBi (4,4'-(diphenylvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4',4"-tri(N-carbazolyl) triphenylamine (TCTA) doped with fac-tris(2-phenylpyridine)iridium ($Ir(ppy)_3$).

In general, the structure of an SM-OLED consists of a stack of HILs (hole injection layers), an HTL (hole transport layer), an emissive layer and an ETL (electron transport layer).

Examples of organic light-emitting stacks are for example described in document U.S. Pat. No. 6,645,645.

If the organic light-emitting layers are polymers, polymer light-emitting diodes (PLEDs) are spoken of.

Preferably, the electrically conductive coating is resistant to the following OLED manufacturing steps;

resistant to 200° C. for 1 h;
resistant to a pH of 13 (cleaning solution);
resistant to a pH comprised between 1.5 and 2 (in particular when depositing a polymer for the electrically conductive coating, before depositing the OLED system); and
delamination resistance (scotch tape test).

A light extraction means may also be located on the exterior face of the substrate, i.e. on that face that will be opposite the first main face bearing the grid electrode. It may be a question of an array of microlenses or micropyramids, such as described in the article in the Japanese Journal of Applied Physics, Vol. 46, No. 7A, pages 4125-4137 (2007) or even of a satin finish, for example a satin finish obtained by etching with hydrofluoric acid.

Lastly, the invention relates to a process for manufacturing an electrically conductive carrier such as defined above, which method comprises the following steps in this order:

providing the substrate comprising:
  the light extraction layer preferably formed by the scattering first surface of the substrate and/or formed by an additional scattering layer (located preferably directly) on the first surface of the substrate; and
  on the light extraction layer, what is called a high-index layer made of the composition with said refractive index $n_3$, which layer comprises said vitreous material that preferably contains no scattering particles, and which layer optionally contains pore-type elements in a volume concentration lower than 0.5%, preferably lower than 0.2% and in particular lower than 0.1%, said high-index layer preferably planarizing the light extraction layer;

forming blind apertures called cavities in the high-index layer, thus forming the partially structured layer, comprising:
  producing, on the high-index layer, a discontinuous masking layer (layer of resist for example, positive or negative photoresist in particular) containing a given arrangement of through-apertures (lines and/or meshes); and
  wet-etching the high-index layer through the through-apertures in the masking layer, the through-apertures especially being flared (getting further apart in the direction opposite the substrate), the flanks of the masking layer jutting out relative to the flanks of the cavities and thus defining surface portions, called internal surfaces, of the masking layer, facing the cavities, the width W0 of the apertures being smaller than the width We of the cavities level with the high surface; and forming the metal grid (with the separation H between the surface called the high surface of the non-electrically conductive fields and the surface of the metal grid), comprising:
  preferably electroless wet deposition of a first metal of the grid partially filling the cavities, which deposition is preferably the only deposition for the metal grid, said first metal being deposited directly on the bottom of the cavities or even on a dielectric (non-metal) underlayer carpeting all or part of the cavity (tie underlayer etc.), this first metal being deposited on the bottom of the cavities, on the flanks of the cavities and entirely on the internal surfaces of the masking layer, thus forming the lateral zones of the strands, these zones being flush with the high surface and less rough than the central zones of the strands (which face the apertures);

and removing the masking layer (preferably using a wet and even ultrasonically assisted process) removing the masking layer preferably not creating protuberances of at least 10 nm in height on the grid surface.

The etching is carried out using a wet etching process. The depth of the cavities is controlled via the concentration of the solution, the solution type, the length of the etching operation, and the temperature of the solution. The masking layer, which is preferably a (photo)resist, is then resistant to the etching solution.

The cavities have flanks that flare in the opposite direction to the substrate (get further apart with distance from the substrate). They may have a cup-shaped or even semi-spherical (type) cross section.

An acid solution may in particular be used with a partially structured layer made of a vitreous material (preferably an enamel), and preferably the masking layer is a (photo)resist and especially a positive photoresist.

The etching obtained with a wet especially acid solution is vertical and lateral in that the (especially acid) etching solution attacks (cuts) in every direction. The etching profile may be cup-shaped or of semi-spherical type.

Next, the optional tie layer is deposited before the first metal.

Advantageously, the wet deposition (preferably the only deposition for the metal grid) may be silvering and preferably the grid is a single layer, the first metal (which is based on silver) even being deposited directly on the bottom of the cavities.

Alternatively, the formation of the metal grid comprises another deposition of a second metal of the grid on the first metal or under the first metal.

If the other deposition is carried out after the wet deposition (such as silvering) it may be electroplating of silver. If the other deposition is carried out before the wet deposition (such as silvering), it may be cathode sputtering of silver. When the grid is obtained using two separate deposition processes of a given metal, such as preferably silver (cathode sputtering and silvering, silvering and electroplating) the properties of the silver layers may differ, and they may especially have a discernible interface.

The solution used in the silvering step may contain a silver salt, an agent for reducing silver ions and even a chelating agent. To carry out the silvering step, various conventional operating modes widely used in the field of mirror manufacturing, and for example described in chapter 17 of the text "*Electroless Plating—Fundamentals and Applications*", edited by Mallory, Glenn O.; Hajdu, Juan B. (1990) William Andrew Publishing/Noyes, may be employed.

In a preferred embodiment, the silvering step comprises bringing the substrate comprising the light extraction layer, the partially structured layer, and the through-aperture-containing masking layer (preferably (photo)resist) into contact (by immersion in a bath or by spraying of a solution) with a mixture of two aqueous solutions, one containing the metal salt, for example silver nitrate, and the other containing the metal-ions ($Ag^+$ ions) reducing agent, for example sodium, potassium, aldehydes, alcohols, or sugars.

The most commonly used reducing agents are Rochelle salt (potassium sodium tartrate $KNaC_4H_4O_6 \cdot 4H_2O$), glucose, sodium gluconate and formaldehyde.

Preferably, before contact is made, the silvering step comprises a sensitizing step (a step of sensitizing the surface of the cavities) preferably comprising a treatment with a tin salt and/or an activating step (for activating the surface of the cavities) preferably comprising treatment with a palladium salt. The function of these treatments is essentially to promote the subsequent metallization (by the silver) and to increase the adhesion of the silver metal layer formed (in the cavities). For a detailed description of these sensitizing and activating steps, the reader may for example refer to patent application US 2001/033935.

More precisely, the silvering operation may be carried out by submerging the substrate comprising the light extraction layer, the partially structured layer and the through-aperture-containing masking layer, which is preferably made of (photo)resist, into troughs, each containing one of the following three solutions, in this order:
  a first preferably stirred (sensitizing) aqueous solution of $SnCl_2$ (preferably for less than 5 minutes, for example 0.5 to 3 min), followed by rinsing in (distilled) water;
  a second preferably stirred (activating) aqueous solution of $PdCl_2$ (preferably for less than 5 minutes, for example 0.5 to 3 min), followed by rinsing in (distilled) water; and
  a third preferably stirred solution that is a mixture of the silver salt, preferably silver nitrate, solution and the silver reducing agent, preferably sodium gluconate, solution (preferably for less than 15 minutes and even than 5 minutes, for example 0.5 to 3 min), followed by rinsing in (distilled) water.

The thus silvered and coated substrate is then removed from the last bath and rinsed in (distilled) water.

Another embodiment consists in spraying the three preceding solutions in the same order as above, rather than submerging the substrate comprising the light extraction layer, the partially structured layer and the through-aperture-containing masking layer, which is preferably (photo)resist.

The masking layer (preferably a resist layer for example and better still a photoresist layer) is preferably removed using a wet process and in particular in an ultrasonic bath of a solvent (acetone, etc.).

The high-index layer preferably comprises (better still consists of) an enamel, the layer especially obtained from a first glass-frit-based composition. Preferably, the additional scattering layer possibly comprises (better still consists of) an enamel containing scattering elements obtained from another glass-frit-based composition that is especially identical to the first composition.

The high-index layer comprising a vitreous material is preferably an enamel obtained by a process in which:
  a glass frit of index $n_3$ is mixed with an organic medium so as to form a paste, called a planarizing paste, preferably without the addition of scattering particles;
  said paste is deposited, for example by screen printing;
  preferably directly on the mineral glass sheet (of scattering surface) or on a mineral barrier layer on the mineral glass sheet (of scattering surface) or even on the additional scattering layer; and
  the assembly is baked.

The additional scattering layer comprising a vitreous material is preferably an enamel obtained by a process in which:
  a glass frit is mixed with an organic medium and preferably with scattering particles so as to form a paste, called a scattering paste;
  said paste is deposited, preferably directly on the (flat and polished or textured and scattering) mineral glass sheet, or on a mineral barrier layer on the mineral glass sheet; and
  the assembly is baked.

The additional scattering layer may be formed by baking the scattering paste before the planarizing paste is deposited, or both pastes may be baked together (one less baking step).

In one configuration, the scattering paste and the planarizing paste have the same composition, especially the same glass frit, and differ only by the presence or absence of scattering particles.

The organic medium is typically chosen from alcohols, glycols, and esters of terpineol. The proportion by weight of medium is preferably comprised in a range extending from 10 to 50%.

The (scattering and/or planarizing) paste may especially be deposited by screen printing, roll coating, dip coating, knife coating, by spraying, spin coating, flow coating or even slot die coating.

In the case of screen printing, a screen having a textile or metal mesh, flow coating tools and a doctor blade are preferably used, the thickness being controlled by the choice of the mesh of the screen and its tension, by the choice of the distance between the glass sheet (or additional scattering layer) and the screen, and by the pressure and speed of movement of the doctor blade. The deposits are typically dried at a temperature of 100 to 150° C. under infrared or ultraviolet radiation depending on the nature of the medium.

Conventionally, the glass frit (70-80% by weight) is mixed with 20-30% by weight of an organic medium (ethyl cellulose and organic solvent).

The paste may be subjected to a heat treatment at a temperature in a range extending from 120 to 200° C., for example in order to set the paste. Next, the paste may be subjected to a heat treatment extending from 350-440° C. in order to remove the organic medium. The bake for forming the enamel takes place above the Tg, typically at a temperature of below 600° C., and preferably below 570° C.

The high surface and the grid may be polished before or after the electrically conductive coating has been deposited.

The process may furthermore comprise, after the (resist, in particular photoresist) masking layer—covered by the one or more grid materials—has been removed, a step of depositing, directly on the grid and (directly) on the partially structured layer, a monolayer or multilayer electrically conductive coating:

- by physical vapour deposition, especially by cathode sputtering, with an optional first deposition of SnZnO or AZO and a second or last or preferably only deposition of ITO or of a deposit based on (doped) ZnO or even $MoO_3$, $WO_3$ or $V_2O_5$; and/or
- by wet processing, for example deposition of an (electrically) conductive polymer, preferably a single deposition of a monolayer electrically conductive coating.

It may be preferable for all of the deposition operations to be wet deposition operations.

The process may comprise, before deposition of the electrically conductive coating, a step of heating (the electrode) to a temperature above 180° C., preferably comprised between 250° C. and 450° C. and in particular between 250° C. and 350° C., for a length of time preferably comprised between 5 minutes and 120 minutes and in particular between 15 and 90 minutes.

And/or, the process may comprise a heating step after deposition of an electrically conductive coating consisting of a mineral, preferably ITO, layer, or of a layer based on (doped) ZnO, this heating being to a temperature above 180° C., preferably comprised between 250° C. and 450° C. and in particular between 250° C. and 350° C., for a length of time preferably comprised between 5 minutes and 120 minutes and in particular between 15 and 90 minutes.

This heating makes it possible to improve the Rsquare of the grid and/or to lower the absorption of the ITO mineral layer.

The invention will now be described in greater detail using nonlimiting examples and figures.

FIG. 1 is a schematic cross-sectional view of an electrically conductive OLED carrier according to a first embodiment of the invention;

FIG. 1a is a detail view of FIG. 1;

FIG. 1b illustrates a schematic top view of the grid used in the carrier in FIG. 1, and FIG. 1c is a schematic top view of a variant of this grid;

FIG. 1f is a scanning electron micrograph of an electrically conductive OLED carrier (without an electrically conductive coating) showing the high surface and a strand of the grid in a first comparative example;

FIG. 1g is a scanning electron micrograph of an electrically conductive OLED carrier (without an electrically conductive coating) showing the high surface and a strand of the grid in a second comparative example produced by the Applicant;

FIG. 1h is a schematic detail view of a cross section through a cavity of the partially structured layer, with the strand of the second comparative example produced by the Applicant;

Figure 1D:
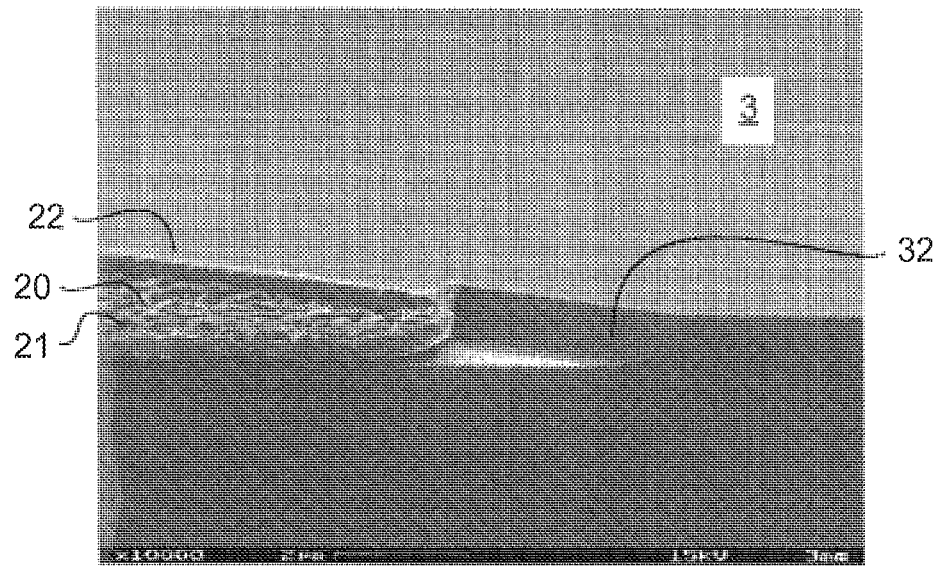
FIG. 1d is a scanning electron micrograph of the electrically conductive OLED carrier (without an electrically conductive coating) according to example No. 1 of the invention, showing the high surface and a strand of the grid.

It will be noted that for the sake of clarity the various elements of the objects shown are not to scale.

FIG. 1, which is schematic, shows a cross section through an electrically conductive and scattering carrier 100 for a bottom-emitting organic light-emitting device (OLED).

This carrier 100 comprises a flat or curved glazing substrate 1 made of organic or preferably mineral glass having a refractive index $n_s$ of 1.3 to 1.6—that is flat or even textured in order to scatter light—having a first main face 11, called the first surface, bearing, in this order with distance from the substrate:

- an optional alkali-metal barrier layer (not shown) if mineral glass is used, or a moisture barrier layer if organic glass is used, such as silicon nitride or $Ti(Zr)O_x$;
- an electrically insulating preferably mineral light extraction layer 41 formed by an additional scattering layer containing scattering elements, which layer is preferably made of high-index vitreous materials of refractive index $n_4$ from 1.7 to 2.3, preferably from 1.80 to 2.10 and in particular from 1.85 to 2.00, these vitreous materials, such as an enamel, containing as scattering elements such as scattering particles 4' and pores 4" (or as a variant only one of these two), this layer being a given and preferably micron-sized thickness $e_4$ and even at most 30 μm in thickness;
- a high-index electrically insulating partially structured layer 3 of refractive index $n_3$ from 1.7 to 2.3, preferably from 1.80 to 2.10, and in particular from 1.85 to 2.00, preferably made of a high-index vitreous material and preferably an enamel, of preferably micron-sized and even at most 20 μm thickness $e_3$, scattering particles not being added to the high-index vitreous material, this layer 3 covering the surface of the additional scattering layer and containing:

- a (continuous, non-textured) region called the low region 30, which here is located directly on the additional scattering layer, of given (preferably micron-sized) thickness e'3, this region 30 covering the surface of the additional scattering layer; and
- a structured region 31 structured with protrusions and recesses, the protrusions defining a flat high surface 31', and the cavities or recesses being bounded by a bottom 32' (defining a low surface) and flanks 32, cavity of height $e_c$, measured in the middle, of preferably at most 1500 nm and larger than 200 nm, the cavities extending with a given uniform or non-uniform arrangement (separate bands, a mesh, etc.), the high surface being flat locally;

an electrode 2, comprising a layer arranged in a grid 20, called the metal grid, which grid is made of metal(s), preferably a silver monolayer, the grid here being a monolayer formed from strands—in other words tracks—20 anchored in the cavities, the strands having a width A smaller than 50 μm, better still smaller than or equal to 30 μm (and at least 1 μm) and being spaced apart by a distance B smaller than or equal to 5000 μm, which grid has a thickness e2 defined in the middle of the strand surface of at least 100 nm and preferably smaller than 1500 nm, the grid having a sheet resistance smaller than 20Ω/□, and even smaller than 10Ω/□, or 5Ω/□; and an electrically conductive coating 5, preferably a monolayer, of thickness $e_5$ smaller than or equal to 100 nm and better still smaller than or equal to 60 nm, of resistivity $\rho_5$ smaller than 20 Ω·cm and higher than the resistivity of the metal grid, and is of given refractive index $n_5$ of at least 1.55, consisting of a mineral layer that is preferably made of ITO (or of AZO or GZO, AGZO) on the grid 2 and on the high surface 31' or as a variant that is a high-index conductive polymeric layer such as a PEDOT:PSS layer deposited by a wet process, of resistivity ρ1 for example of about $10^{-1}$ ohm·cm and of thickness of about 100 nm or more.

To characterize the cavities, as shown in Figure is (detail view of FIG. 1), $A_c$ is defined as the width at the bottom of the cavity, and $B_c$ is defined as the distance between two neighbouring cavity bottoms. $e_c$ is the height measured from the centre of the bottom of the cavity.

The cavities have oblique flanks as a result of the process for wet etching a layer during the formation of the partially structured layer, details of which are given below.

The flanks are flared (they get further apart with distance from the substrate), a horizontal distance L between X and Y being defined such that X is the highest point of the flank and Y is the point at the end of the bottom of the cavity. An L larger than $e_c$ is obtained, L≤2$e_c$ and even L≤1.4$e_c$.

The separation H between the high surface 31' and the surface of the metal grid 2 at the centre of the cavity is larger than 100 nm and better still than 150 nm.

The strands have a central zone 21 that is rough due to the silvering deposition and smooth lateral zones 22, 22' of width L1. The width of the central zone $A_c$ is therefore equal to A-2L1.

The ITO coating 5 is deposited by magnetron cathode sputtering, its surface is conformal to the subjacent surface (surface of the partially structured layer, lateral zones, central zones).

The partially structured layer 3 is flat locally and contains no scattering particles. The partially structured layer contains no pores, or at least few pores that open onto the surface. At the very least the partially structured layer contains no pores liable to scatter light and/or create locally too great a surface roughness.

To manufacture an OLED device, a single- or multiple-(tandem etc.) junction organic light-emitting system and a reflective (or semi-reflective) especially metal, for example silver- or aluminium-based, upper electrode, are then added.

FIG. 1b is a schematic top view of the grid used in the carrier 100 in FIG. 1. The grid 2 is formed of separate linear strands 20 (therefore in separate cavities forming linear troughs) of width A level with the high surface and of distance B level with the high surface. The inter-pattern distance B corresponds to the maximum distance between neighbouring strands.

FIG. 1c is a grid variant with interconnected strands 20 forming closed meshes or patterns that are for example honeycomb-shaped or of any other geometric (square, etc.) or non-geometric shape. The inter-pattern distance B corresponds to the maximum distance between two points of a mesh.

In embodiment No. 1, with regard to FIG. 1, the following features were chosen.

The glass 1 was flat, of haze lower than 1%, made of clear soda-lime-silica glass, for example float glass, of index of about 1.5, for example 0.7 mm in thickness, and of $T_L$ of at least 90%.

The additional scattering layer 4, of thickness $e_4$ equal to 10 μm, was a high-index enamel ($n_4$=1.95 at λ=550 nm) composed of a glass matrix rich in bismuth (at least 55% by weight for example and preferably less than 85% by weight), of Tg below 500° C., and containing scattering particles of $TiO_2$ (average diameter 400 nm) or as a variant of $SiO_2$ (average diameter 300 nm), with a particle density of about $5\times10^8$ particles/mm³ for the $TiO_2$ particles, and about $2\times10^6$ particles/mm³ for the $SiO_2$ particles.

The partially structured layer 3 deposited directly on the scattering layer 4 was composed of the same bismuth-rich matrix ($n_3$=1.95 at λ=550 nm) without addition of scattering particles, of thickness $e_3$ of 9 to 12 μm, for example 10 μm.

The thickness $e_c$ was 500 nm. The cavities of the enamel layer 3 were obtained by acid etching as detailed above.

The partially structured layer 3 was flat locally. The roughness of the high surface 31' was defined by an Ra lower than 1 nm.

The bake above Tg (and even that for removing the organic medium) was for example carried out once after the paste based on the glass frit and scattering particles had been deposited (and after an optional drying operation) and after the same glass frit paste without scattering particles had been deposited.

The $T_L$ of the assembly made up of the glass 1, scattering layer 4 and partially structured layer 3 was 57%, the haze 85%, and the absorption less than 2%.

The grid 2 is a silver monolayer deposited directly in the cavities by silvering. The silver partially fills the cavities, with $e_2$ equal to about 200 nm. H is therefore equal to 300 nm. The pattern of the grid, which is a mesh, is hexagonal. The width A is equal to 12 μm and the maximum distance B 560 μm. The coverage T is 4.5%.

The silver layer was deposited in the partially structured layer 3 using the following operating mode for a thickness e2 of about 200 nm:

the following silvering solutions were diluted (solutions to be diluted provided by the company DR.-ING. SCHMITT, GMBH Dieselstr. 16, 64807 Dieburg/GERMANY):

100 µl of Miraflex®1200 (solution of $SnCl_2$) in a 250 cm³ flask (sol No. 1);

200 µl of Miraflex® PD (solution of $PdCl_2$) in a 250 cm³ flask (sol No. 2);

15 ml of Miraflex®RV (solution of the reducing agent sodium gluconate) in a 250 cm³ flask (sol No. 3); and 15 ml of Miraflex®S (silver nitrate solution) in a 250 cm³ flask (sol No. 4);

the substrate (with the enamel layers 4, 3) was placed in a tray into which the contents of solution No. 1 were poured and stirred for 1 min, before rinsing in distilled water;

the substrate (with the enamel layers 4, 3) was placed in a second tray into which the contents of solution No. 2 were poured and stirred for 1 min, before rinsing in distilled water;

the substrate (with the enamel layers 4, 3) was placed in a last tray into which the contents of solutions Nos. 3 and 4 were poured and stirred for 2 min, before rinsing in distilled water.

The electrically conductive coating 5 consisted of a 50 nm-thick layer of indium tin oxide ITO of refractive index of about 2, and of resistivity $\rho_5$ lower than $10^{-1}$ Ω·cm.

The ITO was deposited by magnetron sputtering under a mixture of argon and oxygen $O_2/(Ar+O_2)$ of 1% at a pressure of $2 \times 10^{-3}$ mbar using a ceramic target made of indium oxide (90% by weight) and tin oxide (10% by weight).

The Rsquare of the assembly after annealing at 600° C. for 20 mins, measured by the conventional 4-point probe method, was approximately 2.5 ohms/square.

FIG. 1d is an atomic force micrograph of the silver grid 2 in the partially structured layer before deposition of the electrically conductive coating, showing the high surface 31 of the partially structured enamel layer 3 and a strand 20 of the grid with a flat lateral zone 22, the central zone 21 being rougher. A flank 32 of the cavity may also be seen.

Figure 1E:
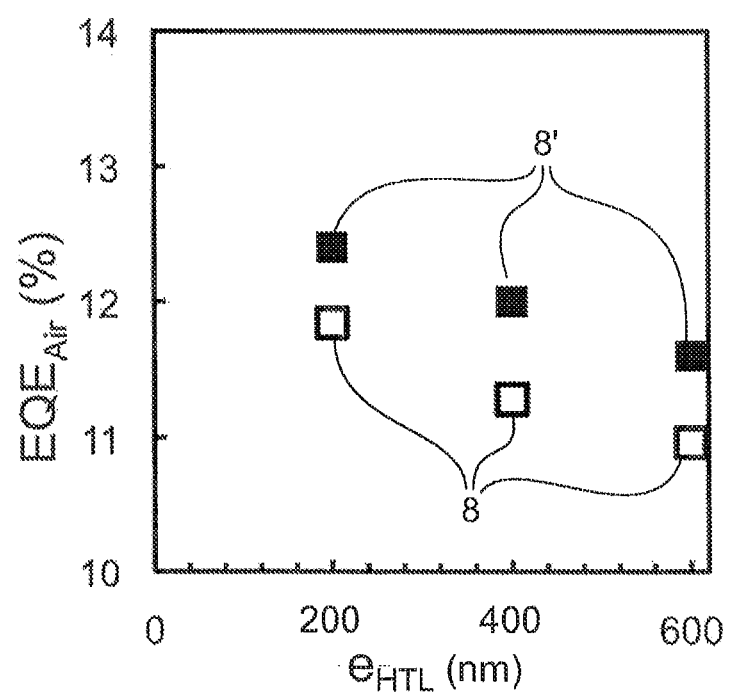
FIG. 1e shows the external quantum efficiency of an OLED made with example No. 1 and of a comparative OLED as a function of HTL thickness.

FIG. 1e shows the dependency of the external quantum efficiency measured in air $EQE_{air}$ as a function of the thickness of the HTL of an OLED made with example No. 1 (curve 8) and a comparative OLED (curve 8').

The comparative OLED was produced by the Applicant using the same glass and the same additional scattering layer, the latter being surmounted by an unstructured layer of identical thickness and of identical material as the partially structured layer and having, as an electrode, an ITO layer identical to that of the coating 5 and of thickness equal to 50 nm and of Rsquare of 100 ohm/square—which Rsquare value is therefore much higher than that of the OLED of example No. 1.

The light-emitting system comprises:

an HTL of variable thickness (between about 200 and 600 nm);

a 10 nm-thick electron blocking layer (EBL);

a 10 nm-thick layer emitting in the orange;

a 25 nm-thick layer emitting in the blue;

a 10 nm-thick hole blocking layer (HBL); and a 40 nm-thick electron transport layer (ETL).

The cathode was a 100 nm-thick aluminium layer.

The $EQE_{air}$ was measured inside an integrating sphere. The $EQE_{air}$ of the OLED according to the invention was satisfactory (between 11% and 12%), and was almost equal to that of the comparative OLED. The difference of about 5% was due to the obstruction of the surface by the silver grid (coverage T of 4.5%). In contrast, because of the lower Rsq of the comparative anode, the OLEDs produced in example No. 1 have luminous efficacies higher by about 20% than those of the comparative OLEDs. Moreover, the OLEDs produced in the example No. 1 have $EQE_{air}$'s higher than those of OLEDs produced with a glass sheet (without a light extraction layer) and an electrode based on ITO, the $EQE_{air}$ of which is about 7.5 to 8%.

FIG. 1f is a scanning electron micrograph showing a strand 20' of a grid 2' obtained by silvering but the central zone of which 21 is flush to less than 100 nm with the high surface 31' of the partially structured enamel layer 3, example produced by way of comparative example by the Applicant.

Protuberances 23 (here continuous) of height of about 50 nm are observed to appear along the interior edge of the smooth lateral surface 22 and of the exterior edge of the rough central surface 21. These protuberances 23 generate leakage currents.

FIG. 1g is a scanning electron micrograph, showing the top of a strand 20" of a grid 2" obtained by magnetron cathode sputtering instead of silvering, and showing the high surface 31 of the layer 3. The silver is deposited by magnetron cathode sputtering under argon at a pressure of $8 \times 10^{-3}$ mbar with a target made of silver.

Because of shadowing due to the masking layer, the lateral zones 22a of the strand are cup-shaped. These cups generate leakage currents.

Thus, FIG. 1h shows a schematic cross-sectional detail view of the profile of a strand 20" of this type of grid made of silver 2", the strand being in a cavity of the partially structured layer 3. The lateral zones 22a and 22b create breaks in morphology generating leakage currents.

Figure 2:
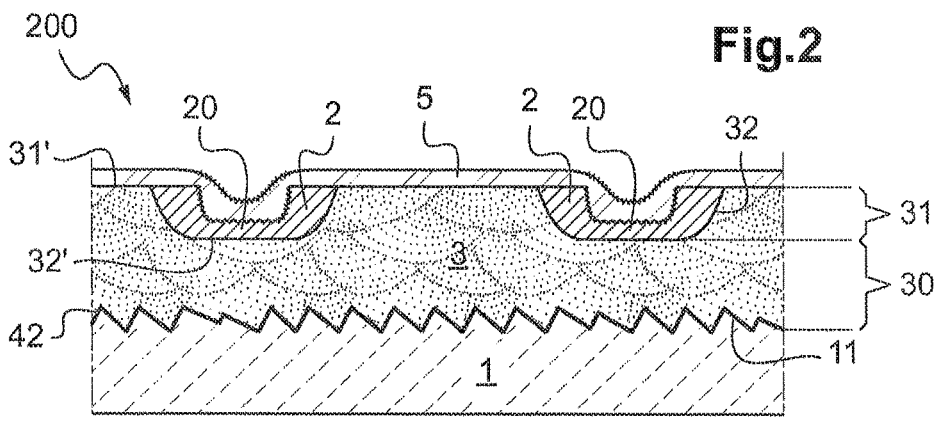
FIG. 2 is a schematic cross-sectional view of an electrically conductive OLED carrier according to a second embodiment of the invention.

FIG. 2 schematically shows a cross section through an electrically conductive carrier 2000 for a bottom-emitting organic light-emitting device (OLED) in a second embodiment of the invention.

Only modifications relative to the carrier 100 are detailed below.

The light extraction layer 42 is formed by the first surface of the glass, which surface is a rough, scattering surface. Thus, the partially structured layer 3 is located directly on the scattering first surface of the glass.

In embodiment No. 2, with regard to FIG. 2, the following features were chosen.

The roughness 42 of the first scattering surface 11 was obtained by etching the glass, for example using hydrofluoric acid. An example of a rough substrate is the glass called Satinovo® Mate produced by the Saint-Gobain company La Veneciana. The protrusions of the etched substrate are for example substantially pyramid-shaped and randomly distributed, scattering light isotropically.

The following table gives the roughness parameters Ra, Rz and the haze.

| Ra (µm) | Rz (µm) | Haze (%) |
|---|---|---|
| 2.40 | 16.9 | 88.0 |

For the high-index partially structured layer 3 the enamel chosen was such as described for the layer of example 1, of thickness $e_3$ of 20 μm.

Alternatively, a scattering surface obtained by abrasion such as described in examples 1 to 5 of patent application WO 2014/048927 may be chosen.

FIGS. 3a to 3g are schematic views (not to scale) of the process for manufacturing the partially structured layer by acid etching, and for manufacturing the silver grid by silvering—in relation to FIG. 1.

Figure 3A:
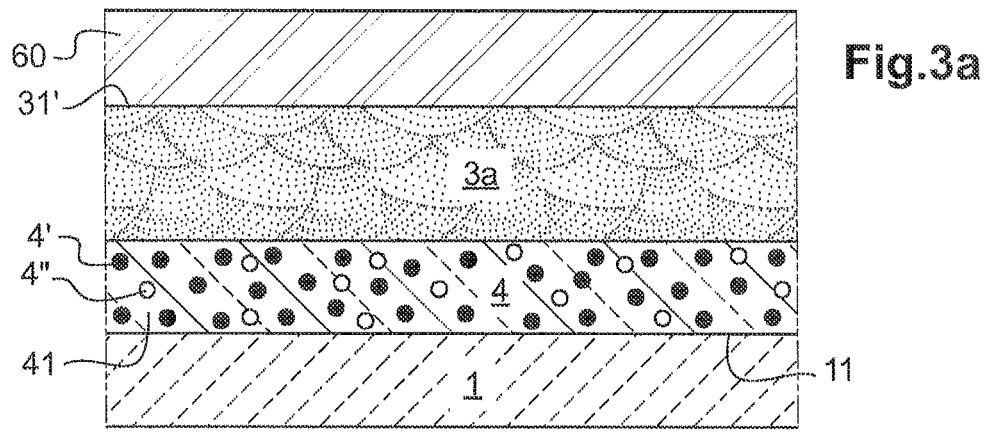
FIGS. 3a to 3g are schematic views of the process for manufacturing the electrically conductive carrier in FIG. 1.

The first step illustrated in FIG. 3a consists, starting with glass 1 coated with the light extraction layer 4 formed by the additional scattering layer on the substrate, which layer is made of a mineral material containing scattering particles:

in forming, on the light extraction layer, a high-index layer 3a that comprises the vitreous material (preferably an enamel) with said refractive index $n_3$; and in applying a layer 60 of a liquid masking material, here a positive photoresist, conventional AZ1505 resist, to the layer 3a.

The photoresist is then baked at 100° C. for twenty minutes in a convection oven. The thickness of the photoresist is 800 nm.

Figure 3B:
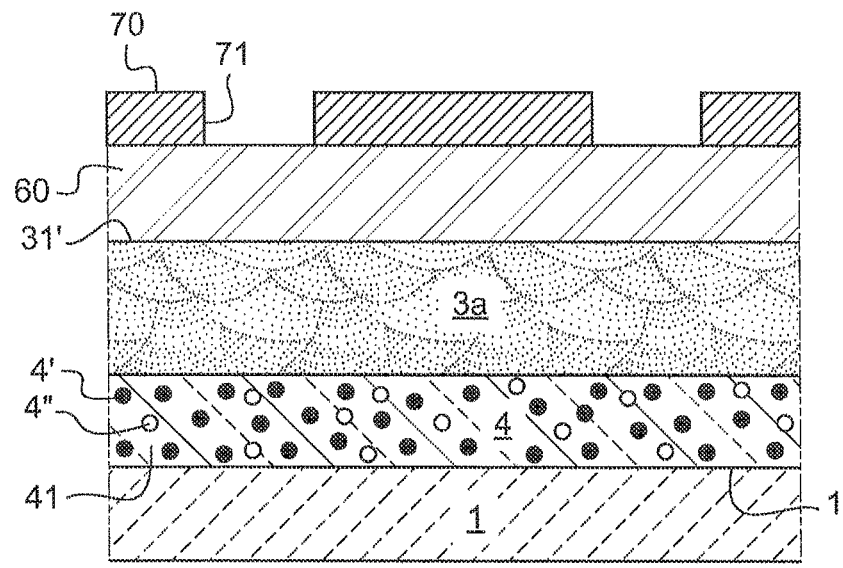

The second step illustrated in FIG. 3b consists in generating the photoresist pattern. To do this, a photolithography mask 70 containing discontinuities 71 is applied to the resist 60 and the resist 60 is irradiated with 20 mW/cm$^2$ of UV (at 365 nm) using an Hg lamp through the discontinuities, in the zones intended to become the through-apertures arranged, in separate (parallel) strips, with a nonuniform or uniform arrangement or interconnected for a mesh.

Figure 3C:
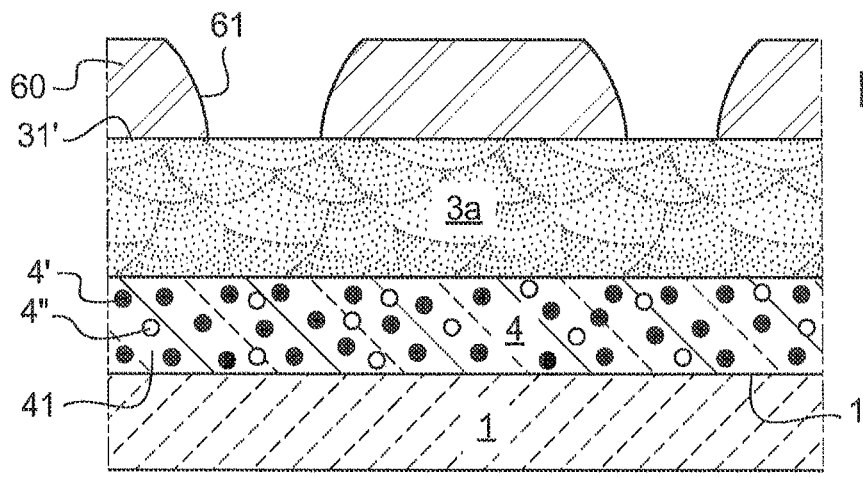

The third step illustrated in FIG. 3c consists in creating through-apertures in the photoresist 60. The irradiated zones are removed by dissolution in a specific development solution based on tetramethyl ammonium hydroxide (TMAH) and rinsed in deionised water, thus forming through-apertures through the photoresist. The flanks 61 of the photoresist bounding the through-apertures are oblique and flare with distance from the glass. Thus, level with the external or upper surface 63 of the photoresist 60, the width of each through-aperture is larger than the width W0 level with the high surface 31'.

Alternatively, a negative photoresist and an inverted photolithography mask (removal of the non-irradiated zones to form the apertures) may be used.

Figure 3D:
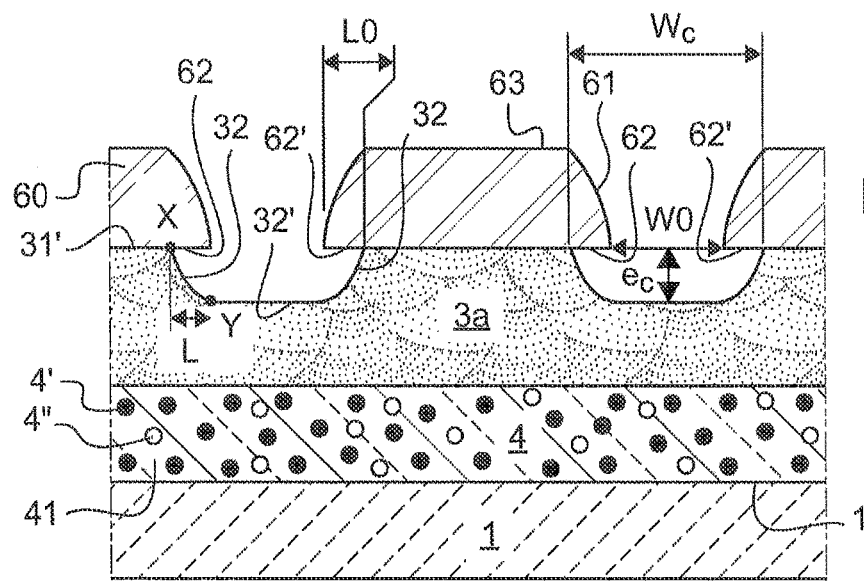

The fourth step illustrated in FIG. 3d consists in creating cavities in the continuous high-index dielectric layer 3a such as the layer made of enamel. The partially structured layer is preferably formed by wet etching rather than dry etching, for example by acid etching at room temperature. The resist 60 chosen is therefore resistant to the etching solution, which is acetic acid of pH 2.1. The etch depth is then controlled by the length of the etch, here of 35 nm·min$^{-1}$. The etch forms cavities of depth $e_c$ with flanks 32 that are oblique, curved and flare with distance from the glass 1.

The etching solution, here an acid, attacks (etches) in all directions: vertically and laterally.

The etching profile is cup-shaped. Each cavity is of larger width Wc than the width W0, leaving surface portions 62, 62' of positive photoresist jutting out relative to the high surface, facing the cavity, these portions being referred to as internal surfaces. The internal surfaces 62, 62' are of width L0 substantially equal to L. The bottom 32' of the cavities is flat.

Figure 4:
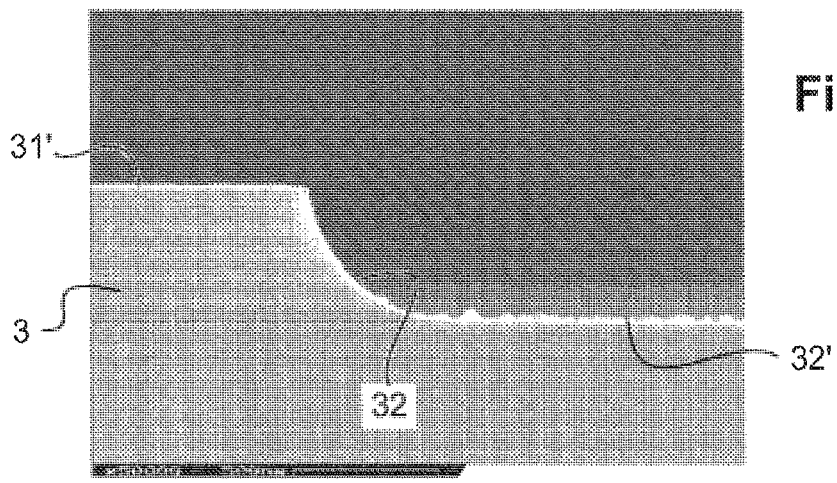
FIG. 4 is a scanning electron micrograph of a cross section through a cavity of the partially structured layer.

FIG. 4 is an SEM micrograph showing a partial cross-sectional view of the partially structured enamel layer 3 and of a cavity with a bottom 32' and a curved flank 32.

Figure 3E:
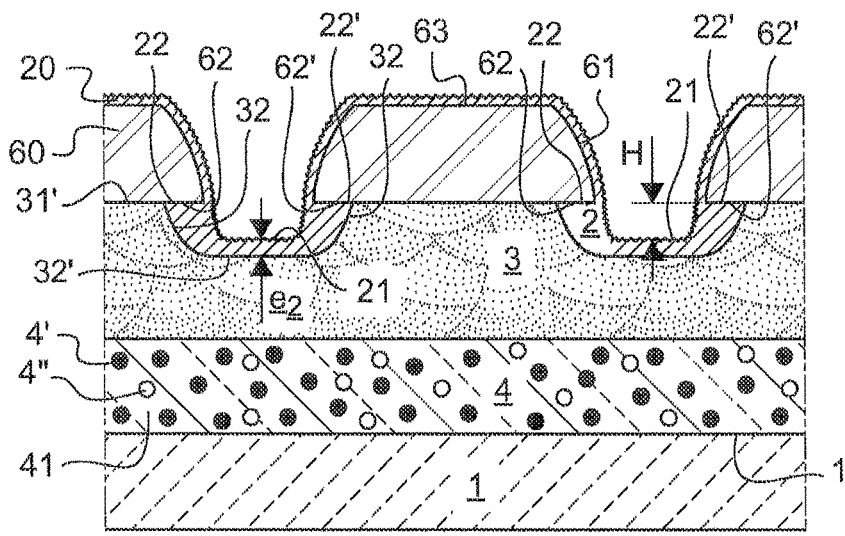

The fifth step illustrated in FIG. 3e consists in depositing the grid metal 2 using a wet and more precisely electroless deposition technique and thus preferably by silvering. The deposition is carried out through the apertures 61 in the photoresist 60 (resistant to acid etching) in the cavities in order to partially fill them. The silver is deposited on the bottom of the cavities, on the flanks of the cavities, on the internal surfaces 62, 62' of the photoresist, on the flanks of the photoresist (and is absent from the high surface of the layer 3) and on the upper surface or the surface called the discontinuous external surface 63.

More precisely, the silvering partially fills each cavity and deposits on the bottom, on the flanks and entirely on the internal surfaces 62, 62' of the masking layer, thus forming lateral strand zones 23, 23' flush with the high surface and less rough then the central strand zone 24 facing the through-aperture. The width L1 of each lateral zone 22, 23' is roughly equal to L0+e2.

Examples of roughness parameters of the central zones and flat lateral zones are collated in the following table, as a function of the thickness $e_2$.

| Area of the strand | $e_2$ (nm) | Rq (nm) | Rmax (nm) |
|---|---|---|---|
| Lateral zones | 200 | 1.5 | 8 |
| Central zone | 200 | 20 | 200 |
| Lateral zones | 300 | 2 | 10 |
| Central zone | 300 | 30 | 300 |
| Lateral zones | 450 | 2 | 10 |
| Central zone | 450 | 35 | 450 |

Figure 3F:
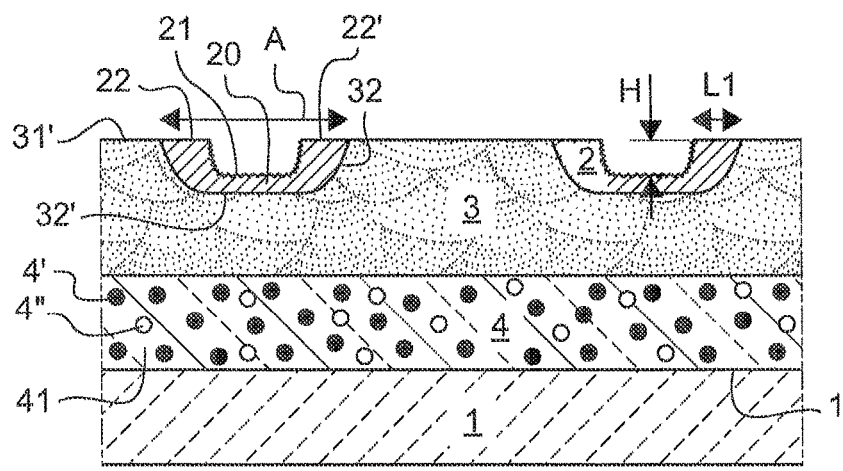

The sixth step illustrated in FIG. 3f consists in removing the photoresist using wet processing with acetone solvent and ultrasound.

Figure 3G:
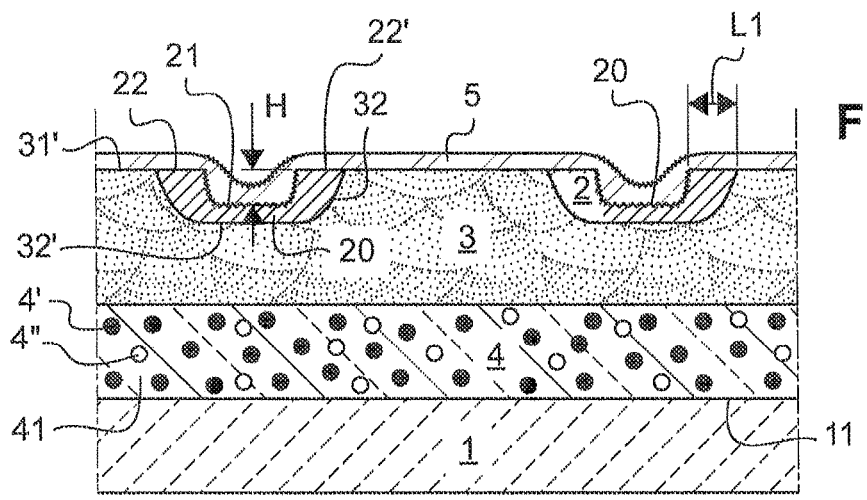

The seventh step illustrated in FIG. 3g consists in depositing by cathode sputtering the electrically conductive coating 5 made of ITO or of AZO, GZO or AGZO. Alternatively it is a question of wet deposition of these materials or even of a conductive polymer.

The invention claimed is:

1. An electrically conductive OLED carrier comprising in this order:

an organic or mineral glass glazing substrate of refractive index $n_1$ of 1.3 to 1.6 having a first main surface; and an electrode, borne by the glazing substrate on a same side as the first main surface, which electrode comprises a layer arranged in a metal grid, which metal grid is made of metal(s) having a sheet resistance smaller than 20Ω/□ and has a thickness e2 of at least 100 nm, the metal grid being formed from strands, the strands having a width A smaller than or equal to 50 μm and being separated by an inter-strand distance B smaller than or equal to 5000 μm, the strands being separated by a plurality of electrically insulating non-electrically conductive fields of refractive index higher than 1.65, wherein, on the same side as the first main surface, the electrically conductive OLED carrier comprises:

an electrically insulating light extraction layer under the metal grid; and an electrically insulating layer partially structured in its thickness, this the electrically insulating layer being of given composition and of refractive index $n_3$ of 1.7 to 2.3, and being located on the electrically insulating light extraction layer, which electrically insulating layer is formed:

from a structured region, located furthest from the light extraction layer, structured with cavities containing the metal grid, the structured region containing the electrically insulating non-electrically conductive fields; and from a low region, located under the metal grid and on the electrically insulating light extraction layer, and wherein the metal grid is set back from a high surface of the electrically insulating non-electrically conductive fields and a separation H between the high surface and a surface of the metal grid is larger than 100 nm, H being measured between the middle of the surface of the strands and the high surface, and in that wherein the strands have along their length a central zone between lateral zones that are flush with the high surface.

2. The electrically conductive carrier according to claim 1, wherein the separation H is larger than 150 nm.

3. The electrically conductive carrier according to claim 1, wherein the surface of the strands is devoid of protuberances of height larger than 10 nm along the interior edges of the lateral zones.

4. The electrically conductive carrier according to claim 1, wherein the metal grid is obtained by electroless deposition.

5. The electrically conductive carrier according to claim 1, wherein a surface roughness of the central zone is higher than the surface roughness of the lateral zones, and the Rq roughness parameter of the lateral zones is at most 5 nm.

6. The electrically conductive carrier according to claim 1, wherein the lateral zones are of width L1, L1 being larger than a height $e_c$ of the cavities and $L1 \leq 2e_c$.

7. The electrically conductive carrier according to claim 1, wherein the metal grid has a coverage T smaller than 25%.

8. The electrically conductive carrier according to claim 1, wherein the thickness $e_2$ of the metal grid is smaller than 1500 nm, and the width A is smaller than 30 μm.

9. The electrically conductive carrier according to claim 1, wherein the one or more metals of the metal grid are selected from the group consisting of silver, copper, nickel and alloys based on these metals.

10. The electrically conductive carrier according to claim 1, wherein the cavities, of height $e_c$ larger than 200 nm, are bounded by flared flanks that get further apart with distance from the glazing substrate, with a horizontal distance L larger than $e_c$ and with $L \leq 2e_c$.

11. The electrically conductive carrier according to claim 1, wherein the structured region does not contain any scattering particles.

12. The electrically conductive carrier according to claim 1, wherein the electrically insulating layer is made of a vitreous material.

13. The electrically conductive carrier according to claim 1, wherein the glazing substrate is made of mineral glass, and the light extraction layer comprises an additional scattering layer the constituents of which comprise a vitreous material and scattering elements, and the composition of the electrically insulating layer comprises a vitreous material, the composition of which is identical to that of the material of the additional scattering layer, and/or wherein a scattering first surface of the glazing substrate, forms part or even is the light extraction layer, and the composition of the electrically insulating layer comprises a vitreous material.

14. The electrically conductive carrier according to claim 1, wherein an electrically conductive coating covers the high surface and the metal grid, the electrically conductive coating having a thickness $e_5$ smaller than or equal to 500 nm, a resistivity $\rho_5$ smaller than 20 Ω·cm and higher than the resistivity of the metal grid, and a refractive index $n_5$ of at least 1.55.

15. The electrically conductive carrier according to claim 14, wherein the electrically conductive coating comprises a mineral layer of refractive index $n_a$ comprised between 1.7 and 2.3.

16. The electrically conductive carrier according to claim 14, wherein the electrically conductive coating comprises, at least as the last layer furthest from the glazing substrate, an organic layer of submicron-sized thickness made of electrically conductive polymer(s) of refractive index $n_b$ of at least 1.55.

17. The electrically conductive carrier according to claim 14, further comprising an organic light-emitting system deposited on the electrically conductive coating, optionally including a hole transport layer HTL or a hole injection layer HIL.

18. An organic light-emitting device incorporating an electrically conductive carrier according to claim 1, the electrode with the metal grid forming a lower electrode, closest to the glazing substrate.

19. A process for manufacturing the electrically conductive carrier according to claim 1, comprising the following steps in this order:

providing the glazing substrate comprising:
    the electrically insulating light extraction layer; and
    on the electrically insulating light extraction layer, a high-index layer made of the composition of refractive index $n_3$;
  forming cavities in the high-index layer, thus forming the partially structured layer, the cavity-forming step comprising:
    producing, on the high-index layer, a discontinuous masking layer containing an arrangement of through-apertures having flanks; and
    wet etching the high-index layer through the through-apertures in the masking layer, the flanks of the masking layer jutting out relative to the flanks of the cavities and thus defining surface portions, of the masking layer, facing the cavities;
  forming the metal grid, the grid-forming step comprising partially filling the cavities by a first metal of the grid, the first metal being deposited on the bottom of the cavities, on the flanks of the cavities and entirely on the internal surfaces of the masking layer, thus forming the lateral zones of the strands, these zones being flush with the high surface and less rough than the central zones of the strands; and
  removing the masking layer.

20. The process for manufacturing the electrically conductive carrier according to claim 19, wherein removing the masking layer does not create protuberances of height of at least 10 nm on the surface of the metal grid.

21. The process for manufacturing the electrically conductive carrier according to claim 19, wherein the cavities are partially filled by electroless wet deposition and the electroless wet deposition is silvering.

22. The process for manufacturing the electrically conductive carrier according to claim 19, wherein the masking layer is a photoresist.

23. The process for manufacturing the electrically conductive carrier according to claim 19, further comprising after the masking layer has been removed, depositing by cathode sputtering of an electrically conductive coating based on ITO or doped zinc oxide, or wet deposition of a polymeric electrically conductive coating.

24. The process for manufacturing the electrically conductive carrier according to claim 19, wherein the high-index layer comprises an enamel.

25. The process for manufacturing the electrically conductive carrier according to claim 23, further comprising, before the electrically conductive coating is deposited, a step of heating to a temperature above 180° C. for a length of time comprised between 5 minutes and 120 minutes, and/or further comprising depositing a mineral layer to form the electrically conductive coating and subsequent heating to a temperature above 180° C. for a length of time preferably comprised between 5 minutes and 120 minutes.

26. The electrically conductive carrier according to claim 4, wherein the metal grid is obtained by silvering.

27. The electrically conductive carrier according to claim 8, wherein the thickness $e_2$ of the metal grid is in a range from 200 nm to 800 nm, and the width A is in a range extending from 1.5 µm to 20 µm.

28. The electrically conductive carrier according to claim 15, wherein the electrically conductive coating is smaller than 150 nm in thickness and made of a transparent electrically conductive oxide.

\* \* \* \* \*

UNITED STATES PATENT AND TRADEMARK OFFICE
CERTIFICATE OF CORRECTION

Page 1 of 1

PATENT NO. : 9,786,849 B2
APPLICATION NO. : 15/326909
DATED : October 10, 2017
INVENTOR(S) : Denis Guimard et al.

It is certified that error appears in the above-identified patent and that said Letters Patent is hereby corrected as shown below:

On the Title Page

Item (56) References Cited, FOREIGN PATENT DOCUMENTS:
Please correct the foreign reference on page 2 as follows:
WO WO 2010/084925 A1 07/2010

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*